(12) United States Patent
Zang et al.

(10) Patent No.: US 9,935,112 B1
(45) Date of Patent: Apr. 3, 2018

(54) SRAM CELL HAVING DUAL PASS GATE TRANSISTORS AND METHOD OF MAKING THE SAME

(71) Applicant: GLOBALFOUNDRIES Inc., Grand Cayman (KY)

(72) Inventors: Hui Zang, Guilderland, NY (US); Srikanth Balaji Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/599,581

(22) Filed: May 19, 2017

(51) Int. Cl.
*H01L 27/11* (2006.01)
*H01L 27/088* (2006.01)

(52) U.S. Cl.
CPC ...... *H01L 27/1104* (2013.01); *H01L 27/0886* (2013.01)

(58) Field of Classification Search
CPC .......................... H01L 27/1104; H01L 27/0886
See application file for complete search history.

(56) References Cited

U.S. PATENT DOCUMENTS

| 6,347,062 B2* | 2/2002 | Nii | G11C 7/18 |
| | | | 257/E27.099 |
| 8,218,354 B2* | 7/2012 | Liaw | G11O 5/063 |
| | | | 365/156 |

(Continued)

*Primary Examiner* — William Coleman
(74) *Attorney, Agent, or Firm* — Heslin Rothenberg Farley & Mesiti P.C.; Stephen Scuderi

(57) ABSTRACT

A static random access memory (SRAM) cell includes $1^{st}$ and $2^{nd}$ fins disposed on a substrate. A $1^{st}$ pass gate transistor ($1^{st}$ PG) is embedded in the $1^{st}$ fin. The $1^{st}$ PG has a source region and a drain region disposed over the $1^{st}$ and $2^{nd}$ fins. A $1^{st}$ gate structure ($1^{st}$ PG-G) is disposed over the $1^{st}$ fin and between the source and drain regions. The $1^{st}$ PG-G is electrically connected to a $1^{st}$ word line. A $2^{nd}$ pass gate transistor ($2^{nd}$ PG) is embedded in the $2^{nd}$ fin. The $2^{nd}$ PG has the same source and drain regions. A $2^{nd}$ gate structure ($2^{nd}$ PG-G) is disposed over the $2^{nd}$ fin and between the source and drain regions. The $2^{nd}$ PG-G is electrically connected to a $2^{nd}$ word line. A $1^{st}$ CT pillar is disposed between the $1^{st}$ PG-G and $2^{nd}$ PG-G.

16 Claims, 17 Drawing Sheets

(56) References Cited

U.S. PATENT DOCUMENTS

| | | | |
|---|---|---|---|
| 8,315,084 B2* | 11/2012 | Liaw | G11C 11/413 365/154 |
| 9,099,172 B2* | 8/2015 | Liaw | G11C 8/16 |
| 9,362,290 B2* | 6/2016 | Liaw | G11C 11/412 |
| 9,418,728 B2* | 8/2016 | Liaw | G11C 11/412 |
| 9,564,211 B2* | 2/2017 | Liaw | G11C 11/419 |
| 2011/0026289 A1* | 2/2011 | Liaw | G11C 11/412 365/51 |
| 2013/0154027 A1* | 6/2013 | Liaw | G11C 11/412 257/390 |
| 2014/0254246 A1* | 9/2014 | Liaw | H01L 29/6681 365/154 |

* cited by examiner

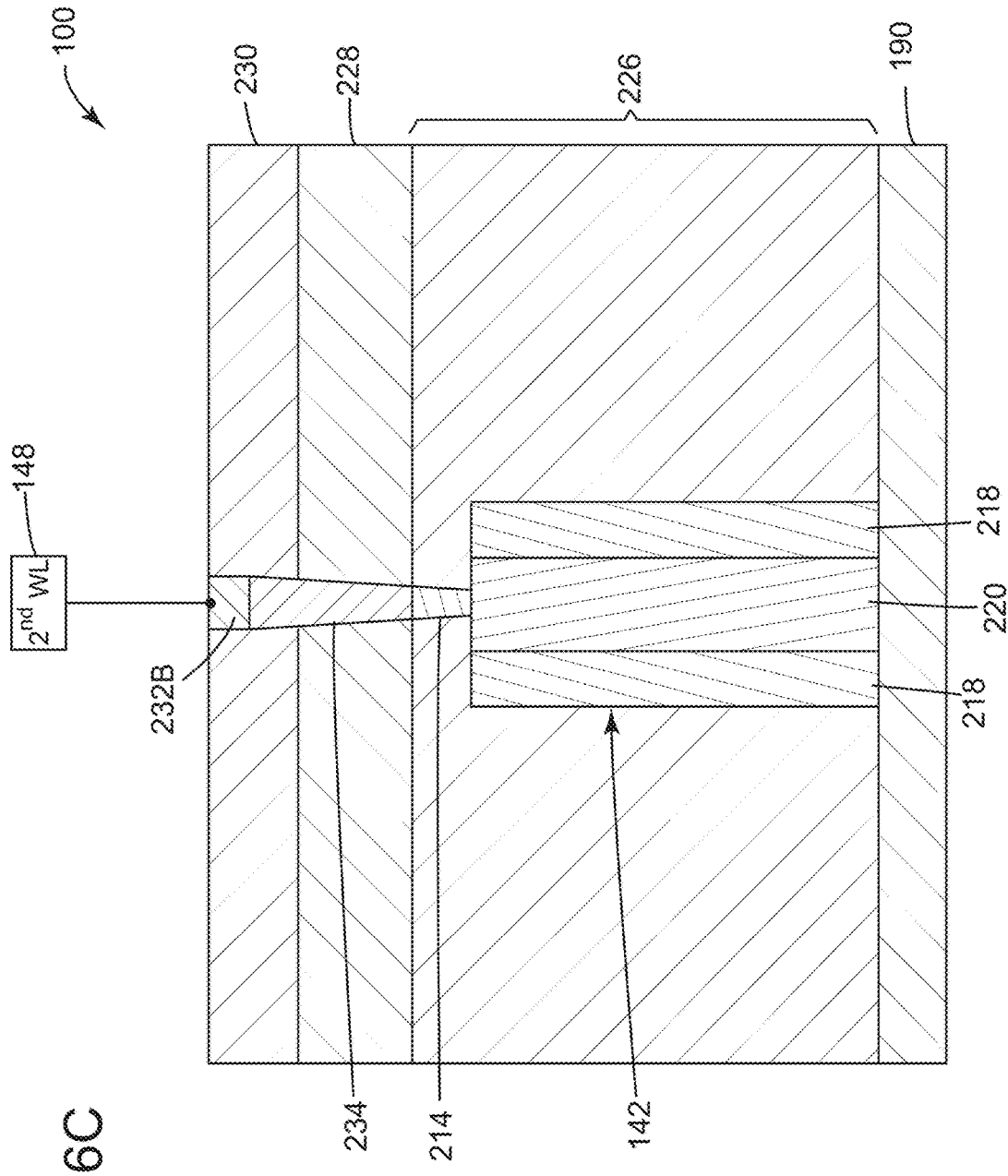

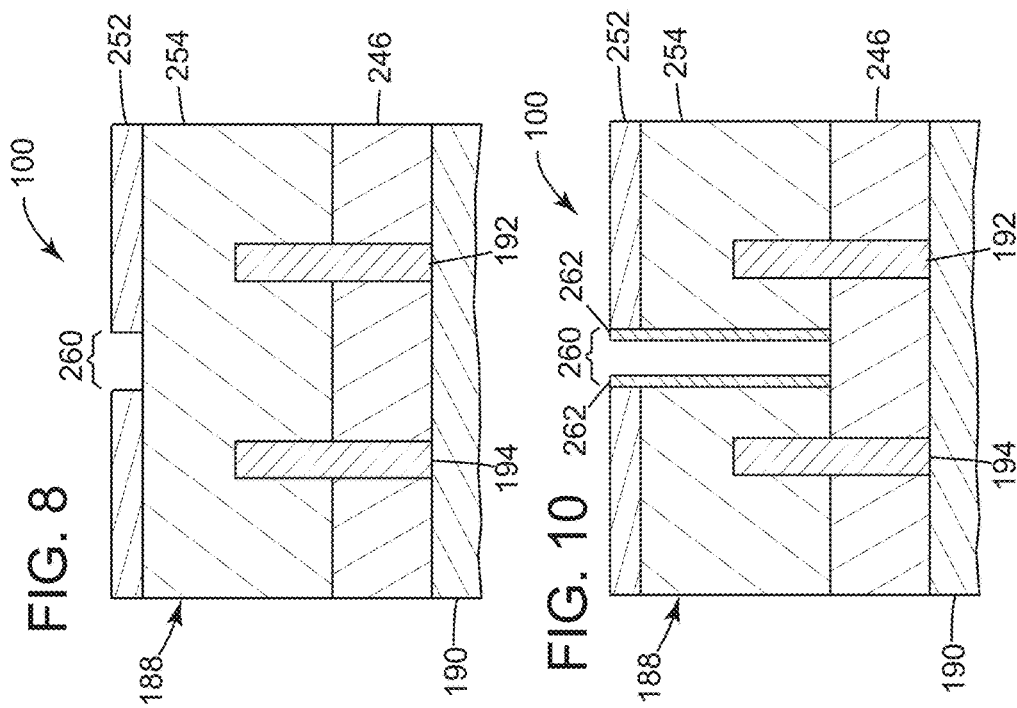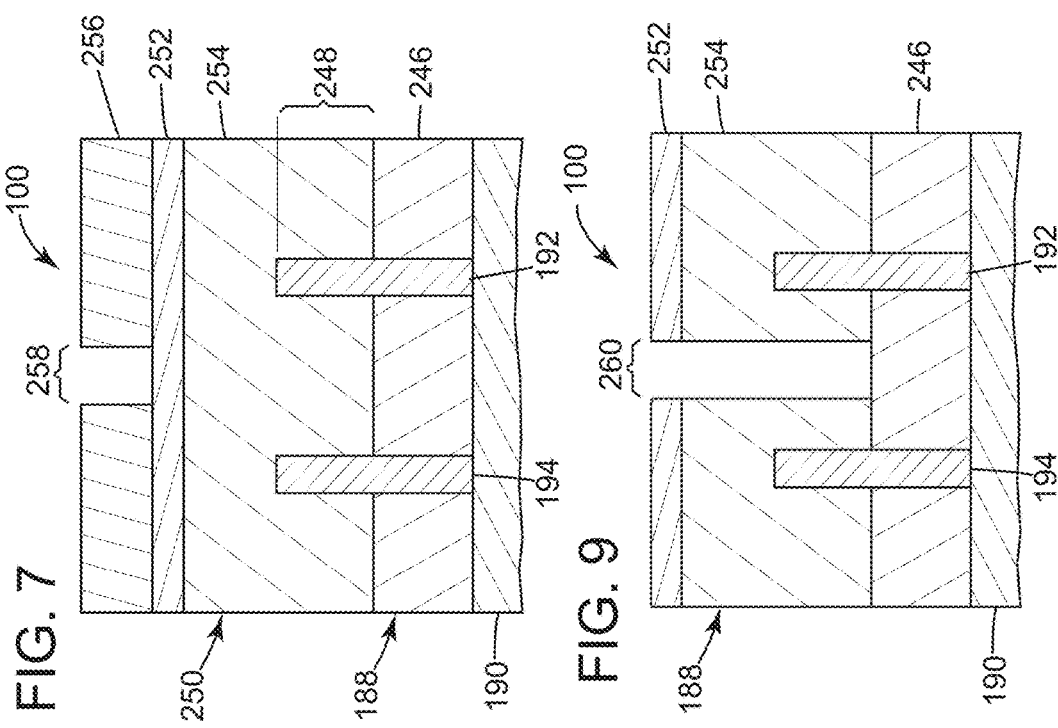

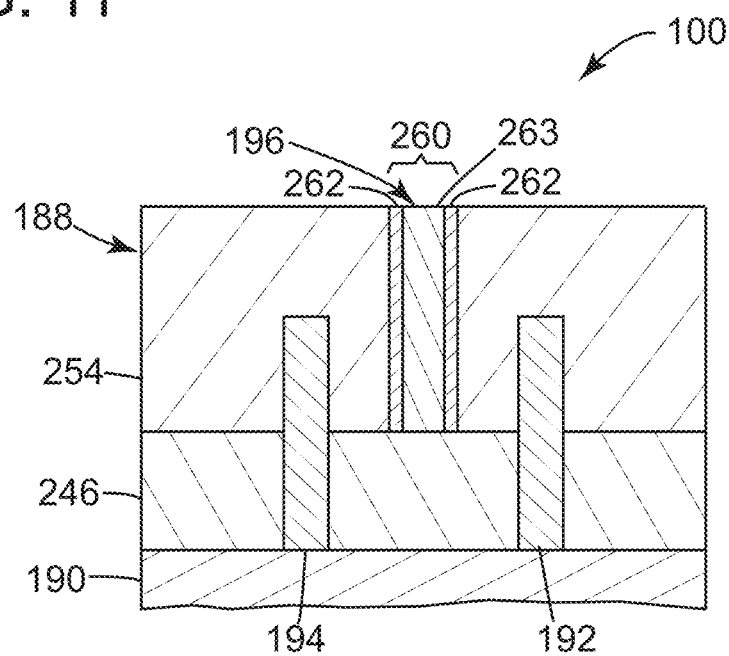

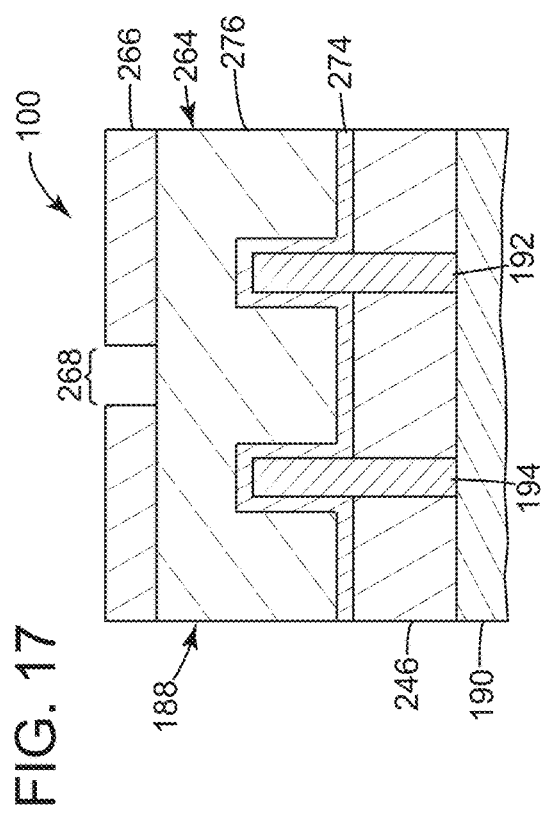
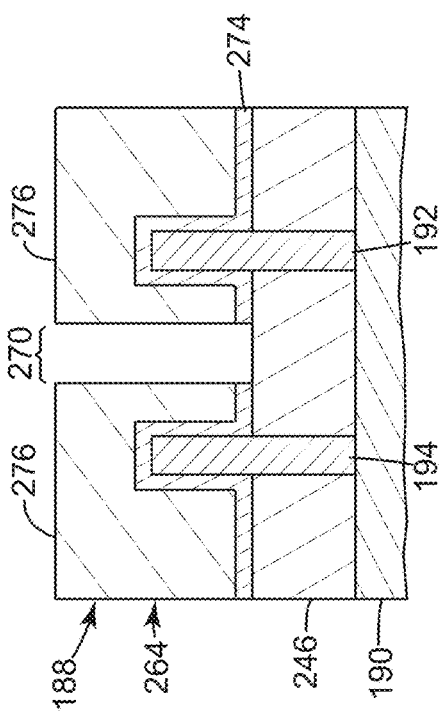
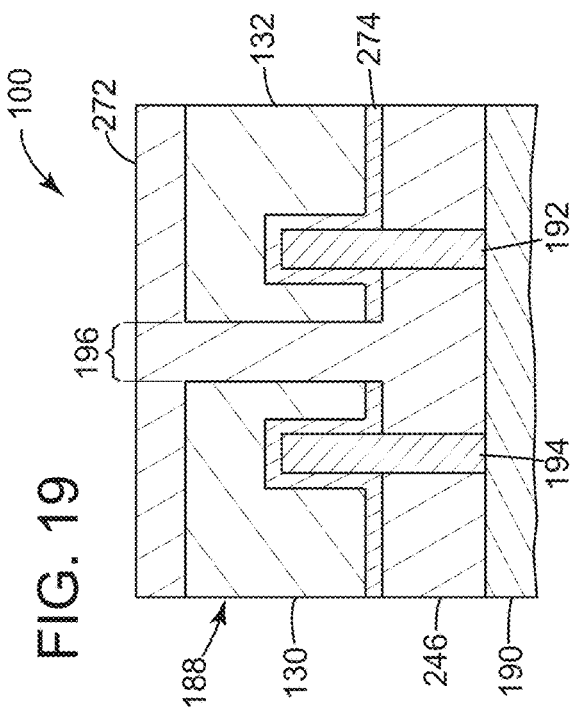

US 9,935,112 B1

SRAM CELL HAVING DUAL PASS GATE TRANSISTORS AND METHOD OF MAKING THE SAME

TECHNICAL FIELD

The present invention relates to semiconductor devices and methods of making the same. More specifically, the invention relates to a FinFET static random access memory (SRAM) cell, wherein the pass gate transistors are connected in parallel to enable two mode operation during read and write operations, and a method of making the same.

BACKGROUND

SRAM cells in general are random access memory cells that retain data bits in their memory as long as power is being supplied. SRAM is typically used in personal computers, workstations, routers, peripheral equipment and the like.

SRAM cells are composed of a pair of cross coupled inverters (a 1st IN and a 2nd IN) connected together to form dual (a first and a second) storage node outputs with opposing logic states. Therefore SRAM cells have two stable logic states. The first logic state includes a logic 1 and a logic 0 (1, 0) at the first and second storage node outputs respectively. The second state includes a logic 0 and a logic 1 (0, 1) at the same first and second storage node outputs respectively.

The storage nodes will be connected to a pair of pass gate transistors (a 1st PG and a 2nd PG), which are typically n-type transistors. Typically each inverter includes a p-type pull up transistor (PU) and an n-type pull down transistor (PD). One of the pass gate transistors is connected to a bit line (BL) and the other to a bit line bar (BLB) (herein collectively "the bit lines"). A word line (WL) enables the pass gate transistors to control data flow between the inverters and the bit lines during read and write operations.

Generally in a semiconductor SRAM cell, the four n-type transistors (i.e., the two PG and two PD) are Fin Field Effect Transistors (FinFETs) imbedded in n-type fins. Additionally, the two p-type transistors (the two PU) of the SRAM cell are FinFETs imbedded in p-type fins. Accordingly, these types of SRAM cells are often known as FinFET SRAM cells.

During a read operation, it is imperative that the data stored in the SRAM cells remain stable and should not be affected by the read operation itself. Additionally, during a write operation, the data stored in the SRAM cells must be accurately and stably overwritten by the data on the bit lines. Data errors due to instability during a read or write operation are known as soft errors.

Several parameters can affect SRAM stability. However, two of the most important parameters that affect SRAM stability are the well-known Beta and Gamma ratios. Basically, the two ratios can be expressed as:

Beta ratio=($Ion\_PD$)/($Ion\_PG$); and

Gamma ratio=($Ion\_PG$)/($Ion\_PU$);

wherein:
  $Ion\_PD$ is the mean drive current flow through the pull-down transistor;
  $Ion\_PG$ is the mean drive current flow through the pass gate transistor; and
  $Ion\_PU$ is the mean drive current flow through the pull-up transistor.

To achieve good stability during a read operation the pull-down transistor must have a larger mean drive current than the pass gate transistor. Therefore, the Beta ratio must be greater than 1, and should be substantially greater than 1 if possible. To achieve good stability during a write operation, the pass gate transistor must have a larger mean drive current than the pull-up transistor. Therefore, the Gamma ratio must also be greater than 1, and should be substantially greater than 1 if possible.

However, it is also a well-known that the pull-up transistor should have as large a mean drive current as possible in order to achieve good stability during read and write operations. Therefore, in conventional prior art SRAM cells, the mean drive currents of the pull-down, pass gate and pull-down transistors will not be far apart.

Problematically, to achieve good stability in conventional prior art SRAM cells, the requirements of a high Beta ratio, a high Gamma ratio and a large mean drive current pull-up transistor are closely related. As such, it is difficult to achieve all three without tradeoffs in performance.

Also problematically, unavoidable manufacturing variations (such as variations in critical dimensions of the fins, spacers, channel widths and more) will affect the Beta ratio, Gamma ratio and transistor drive currents of large batch produced SRAM cells. This can lead to an increased probability of soft errors due to these manufacturing variations.

Accordingly, there is a need for an SRAM cell structure, and method of making the same, that can achieve a high Beta ratio during a read operation and a high Gamma ratio during a write operation for increased stability during both operations. Also, there is a need for an SRAM cell structure, and method of making the same, that has a stability that is less susceptible to manufacturing tolerances and variations.

BRIEF DESCRIPTION

The present invention offers advantages and alternatives over the prior art by providing a dual operating mode SRAM cell, and method of making the same. More specifically, two pass gate transistors are connected in parallel at each storage node of the SRAM cell. The dual pass gates share the same source and drain regions, however their gate structures are electrically isolated by a CT pillar. As such, the gate structures are separately controlled and independently operated. The two gate structures are independently controlled by two word lines. As such, during a write operation, both gates may be enabled to increase the pass gate transistor's mean drive current and to increase the Gamma Ratio. During a read operation, only one gate may be enabled to decrease the pass gate transistor's mean drive current and to increase the Beta ratio. The two drive current operation makes the stability of the SRAM cell more tolerant to manufacturing variations and transistor performance than that of prior art SRAM cells. The added stability is achieved with very little increase in the overall layout design of the SRAM cell over prior art SRAM cells.

A static random access memory (SRAM) cell in accordance with one or more aspects of the present invention includes a 1st and a 2nd adjacent, and parallel, fins disposed on a substrate. A 1st pass gate transistor (1st PG) is embedded in the 1st fin. The 1st PG has:
  a source region ($1^{st}$ PG-S) disposed over the $1^{st}$ and $2^{nd}$ fins,
  a drain region ($1^{st}$ PG-D) disposed over the $1^{st}$ and $2^{nd}$ fins, and
  a $1^{st}$ gate structure ($1^{st}$ PG-G) disposed over the $1^{st}$ fin and between the $1^{st}$ PG-S and $1^{st}$ PG-D.

The 1st PG-G is electrically connected to a 1st word line (1st WL). The 1st WL is operable to enable the 1st PG. A 2nd pass gate transistor (2nd PG) is embedded in the 2nd fin, the 2nd PG has:

the same 1st PG-S and 1st PG-D, and a 2nd gate structure (2nd PG-G) disposed over the 2nd fin and between the 1st PG-S and 1st PG-D.

The 2nd PG-G is electrically connected to a 2nd word line (2nd WL). The 2nd WL is operable to enable and disable the 2nd PG. A 1st CT pillar is disposed between the 1st PG-G and 2nd PG-G. The 1st CT pillar provides electric isolation between the 1st PG-G and 2nd PG-G.

Another SRAM cell in accordance with one or more aspects of the present invention includes a 1st inverter (1st IN) electrically cross-coupled with a 2nd inverter (2nd IN) to form a first storage node (1st SN) and a second storage node (2nd SN). A 1st pass-gate transistor (1st PG) has a source region (1st PG-S), a drain region (1st PG-D) and a gate structure (1st PG-G). A 2nd pass-gate transistor (2nd PG) has the 1st PG-S, the 1st PG-D and a gate structure (2nd PG-G). The 1st PG-D is in electric contact with the 1st SN. A 3rd pass-gate transistor (3rd PG) has a source region (3rd PG-S), a drain region (3rd PG-D) and a gate structure (3rd PG-G). A 4th pass-gate transistor (4th PG) has the 3rd PG-S, the 3rd PG-D and a gate structure (4th PG-G). The 3rd PG-D is in electric contact with the 2nd SN. A 1st word line (1st WL) is in electric contact with the 1st PG-G and the 3rd PG-G. The 1st WL is operative to enable the 1st PG and the 3rd PG. A 2nd word line (2nd WL) is in electric contact with the 2nd PG-G and the 4th PG-G. The 2nd WL is operative to enable the 2nd PG and the 4th PG.

A method in accordance with one or more aspects of the present invention includes providing a semiconductor structure for an SRAM cell, the semiconductor structure having a substrate. A 1st and a 2nd adjacent, and parallel, fins are disposed on the substrate. A 1st pass gate transistor (1st PG) is disposed in the 1st fin. The 1st PG has:

a source region disposed over the 1st and 2nd fins, a drain region disposed over the 1st and 2nd fins, and a 1st pass gate transistor gate structure (1st PG-G) disposed over the 1st fin and between the source and drain regions.

A 2nd pass gate transistor (2nd PG) is disposed in the 2nd fin. The 2nd PG has:

the same source and drain regions as the 1st PG, and a 2nd pass gate transistor gate structure (2nd PG-G) disposed over the 2nd fin and between the source and drain regions.

A CT pillar is disposed between the 1st PG-G and 2nd PG-G. The CT pillar provides electric isolation between the 1st PG-G and 2nd PG-G.

DRAWINGS

The invention will be more fully understood from the following detailed description taken in conjunction with the accompanying drawings, in which:

FIG. 6C is a cross sectional view of FIG. 6A taken along the cut line 6C-6C in accordance with the present invention;

FIG. 7 is a cross sectional view of the SRAM cell of FIG. 6A at an intermediate stage of manufacture taken along the cut line 7-7 of FIG. 6A in accordance with the present invention;

FIG. 8 is a cross sectional view of FIG. 7 after a CT trench is disposed in a hardmask layer in accordance with the present invention;

FIG. 9 is a cross sectional view of FIG. 8 after the CT trench is disposed in a polysilicon dummy gate in accordance with the present invention;

FIG. 10 is a cross sectional view of FIG. 9 after CT spacers are disposed on sidewalls of the CT trench in accordance with the present invention;

FIG. 11 is a cross sectional view of the SRAM cell of FIG. 10 after an insulating layer has been disposed thereon in accordance with the present invention;

FIG. 17 is a cross sectional view of the SRAM cell of FIG. 16 after a metal layer is disposed thereon taken along the line 17-17 of FIG. 16 in accordance with the present invention;

FIG. 18 is a cross sectional view of FIG. 17 after a CT trench is disposed in a metal gate structure in accordance with the present invention; and FIG. 19 is a cross sectional view of FIG. 18 after an insulating layer has been disposed over the SRAM cell and into the CT trench to form a CT pillar in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
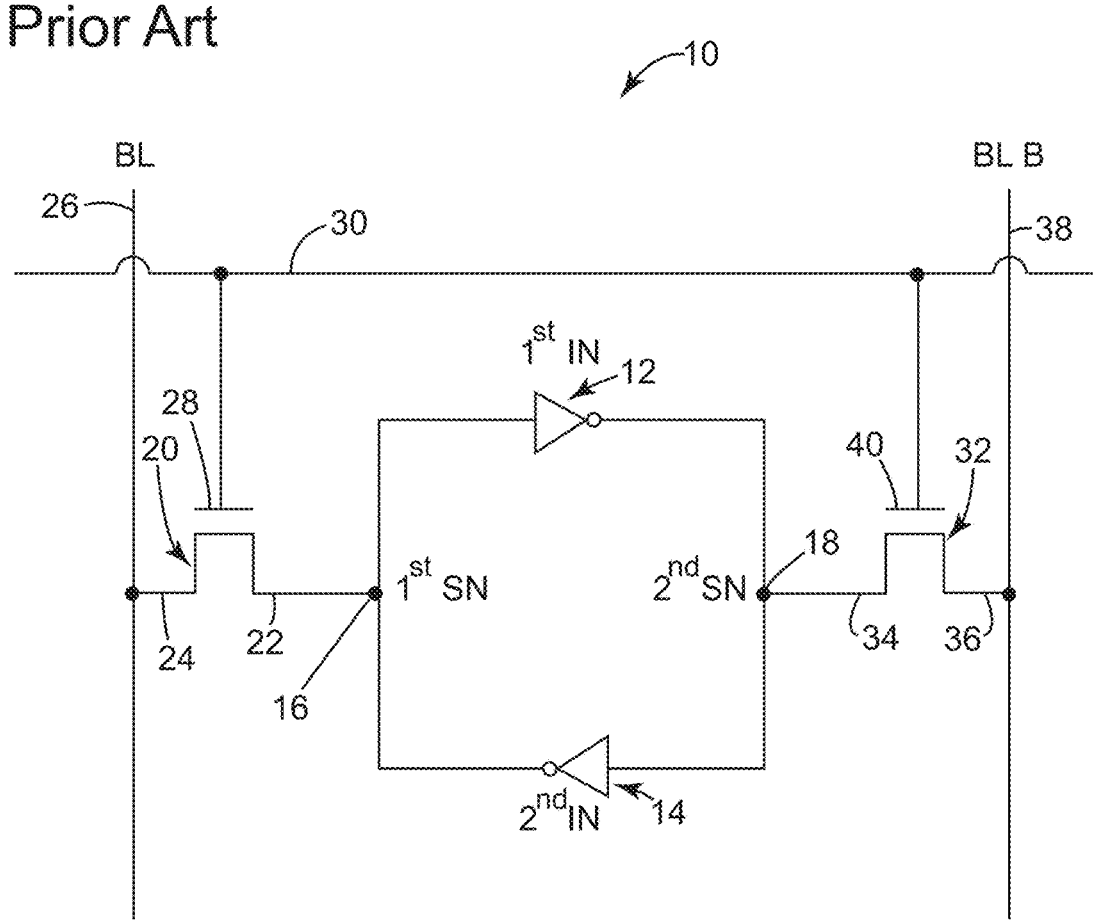
FIG. 1 is a schematic of a prior art SRAM cell showing a 1st and 2nd pass gate transistors and a pair of cross coupled inverters.
Figure 2:
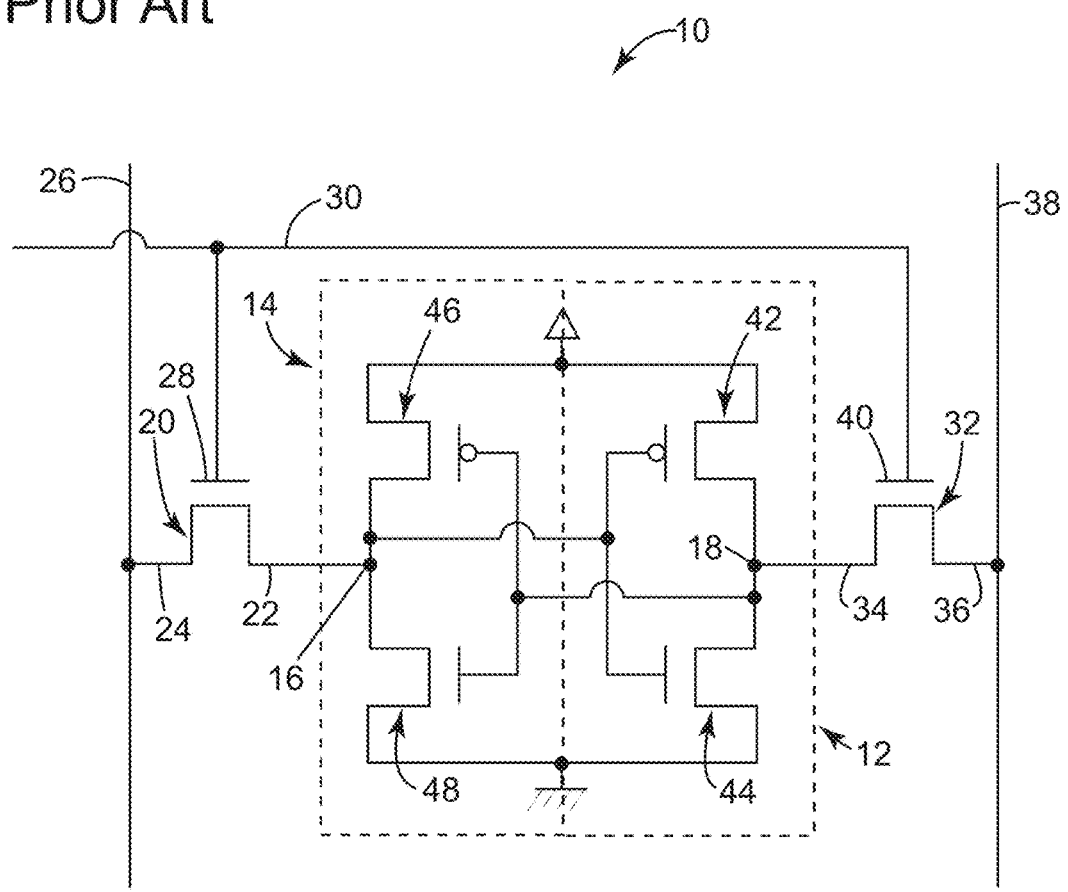
FIG. 2 is a schematic of the prior art SRAM cell of FIG. 1 shown as a six transistor SRAM cell.
Figure 3:
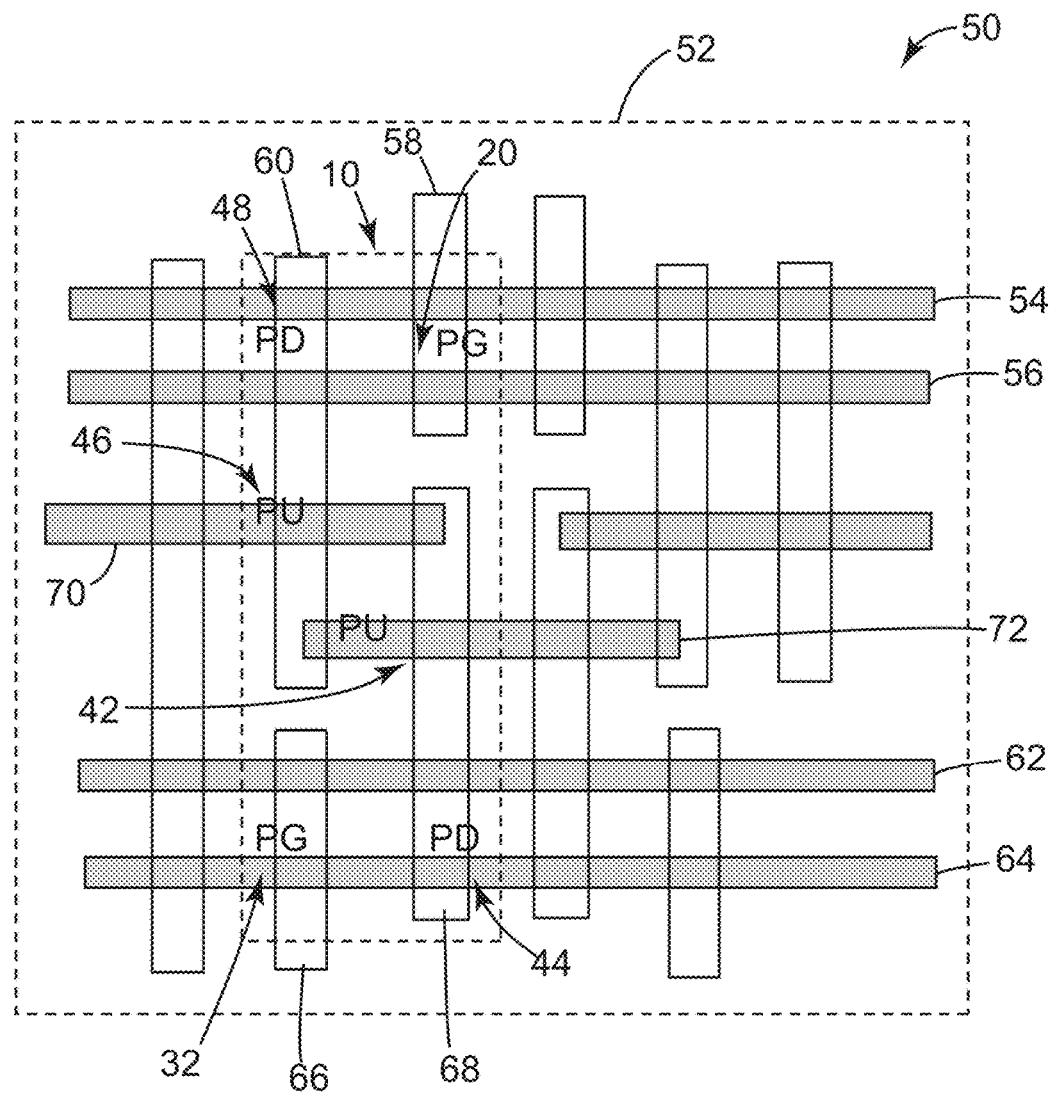
FIG. 3 is a top view layout of the prior art six transistor SRAM cell of FIG. 2 on a semiconductor structure having a substrate layer.

FIGS. 1-3 illustrate an exemplary embodiment of a prior art static random access memory (SRAM) cell. FIGS. 4-6B illustrate various exemplary embodiments of the structure of an SRAM cell in accordance with the present invention. FIGS. 7-13 illustrate various methods of making an SRAM cell in accordance with the present invention.

Referring to FIG. 1, a schematic of a typical prior art SRAM cell 10 is shown. In its most basic form, prior art SRAM cell 10 includes a first inverter (1st IN) 12 that is electrically cross-coupled to a second inverter (2nd IN) 14 to form a first storage node (1st SN) 16 and a second storage node (2nd SN) 18.

A first, typically n-type, pass gate transistor (1st PG) 20 is electrically connected to the 1st SN 16 through its drain region (1st PG-D) 22. The source region (1st PG-S) 24 of the first pass gate transistor 20 is connected to a bit line (BL) 26. The gate structure (1st PG-G) 28 of the 1st PG is connected to a word line (WL) 30.

A second, typically n-type, pass gate transistor (2nd PG) 32 is electrically connected to the 2nd SN 18 through its drain region (2nd PG-D) 34. The source region (2nd PG-S) 36 of the second pass gate transistor 32 is connected to a bit line bar (BLB) 38 (collectively, the BL 26 and BLB 38 being referred to herein as the "bit lines"). The gate structure (2nd PG-G) 40 of the 2nd PG 32 is connected to the WL 30.

The cross-coupled inverters 12, 14 provide an output at the 1st SN 16 and 2nd SN 18 that are always the logic inverse of each other. Therefore the prior art SRAM 10 has only two stable logic states wherein either:

$1^{st}$ SN 16 has a logic high signal and $2^{nd}$ SN 18 has a logic low signal; or $1^{st}$ SN 16 has a logic low signal and $2^{nd}$ SN 18 has a logic high signal.

When the word line 30 is high, the pass gates 20, 32 are enabled and data will be transmitted between the storage nodes 16, 18 and the bit lines 26, 38 during a read or write operation. More specifically, during a stable read operation, the data at the storage nodes 16, 18 will be transmitted to the bit lines 26, 38 without changing the data at those nodes. Additionally, during a stable write operation, the data at the bit lines 26, 38 will overwrite the data at the storage nodes 16, 18 without changing the data at those bit lines.

Problematically, however, the beta ratios and gamma ratios of the prior SRAM 10 are not adjustable. Moreover, due to manufacturing tolerances, these ratios are not always optimal for both the read operation and the write operation, which can lead to soft errors and instability. Such soft errors would include:

changing the data at the $1^{st}$ SN 16 and $2^{nd}$ SN 18 during a read operation;

not properly overwriting the data at the $1^{st}$ SN and $2^{nd}$ SN during a write operation; or changing the data at the bit lines 26, 38 during a write operation.

Referring to FIG. 2, the 1st IN 12 commonly includes a first, typically p-type, pull-up transistor (1st PU) 42 and a first, typically n-type, pull-down transistor (1st PD) 44, which are wired as shown in FIG. 2. Additionally the 2nd IN 14 commonly includes a second, typically p-type, pull-up transistor (2nd PU) 46 and a second, typically n-type, pull-down transistor (2nd PD) 48, which are also wired as shown in FIG. 2.

Accordingly, this SRAM cell 10 is known as a six transistor SRAM cell 10, which is a common configuration of the SRAM cell. However, it is well-known that other transistor numbers and configurations may be included in the design of the inverters 12 and 14.

Referring to FIG. 3, layout of the prior art six transistor SRAM cell 10 is illustrated on a semiconductor structure 50 having a substrate layer 52. Extending over the substrate 52 is a pair of n-type 1st and 2nd fins 54 and 56. Embedded in the 1st and 2nd fins 54, 56 are the 1st PG 20 and the 2ndt PD 48. Both the 2nd PD 48 and 1st PG 20 are dual channel transistor, which means that they utilize both the 1st fin 54 and 2nd fin 56 to conduct current. As such, a single gate structure 58 extends over both the 1st and 2nd fins 54, 56 to operate the 1st PG 20. Additionally, a single gate structure 60 extends over both the 1st and 2nd fins 54, 56 to operate the 2nd PD 48.

Also extending over the substrate 52 is a pair of n-type 3rd and 4th fins 62 and 64. Embedded in the 3rd and 4th fins 62, 64 are the 2nd PG 32 and the 1st PD 44. Both the 1st PD 44 and 2nd PG 32 are also dual channel transistors, utilizing both the 3rd and 4th fins 62, 64 to conduct current. As such, a single gate structure 66 extends over both the 3rd and 4th fins 62, 64 to operate the 2nd PG 32. Additionally, a single gate structure 68 extends over both the 3rd and 4th fins 62, 64 to operate the 1st PD 44.

Finally, a pair of p-type 5th and 6th fins 70 and 72 extend over the substrate. Embedded in the 5th fin 70 is the 2nd PU 46. Embedded in the 6th fin 72 is the 1st PU 42. Both the 1st and 2nd PU 42, 46 are single channel transistors utilizing only one fin each to conduct current. Note though, that the gate structure 60, which enables the 2nd PD 48, also enables the 2nd PU 46. Also the gate structure 68, which enables the 1st PD 44, also enables the 1st PU 42.

Figure 4:
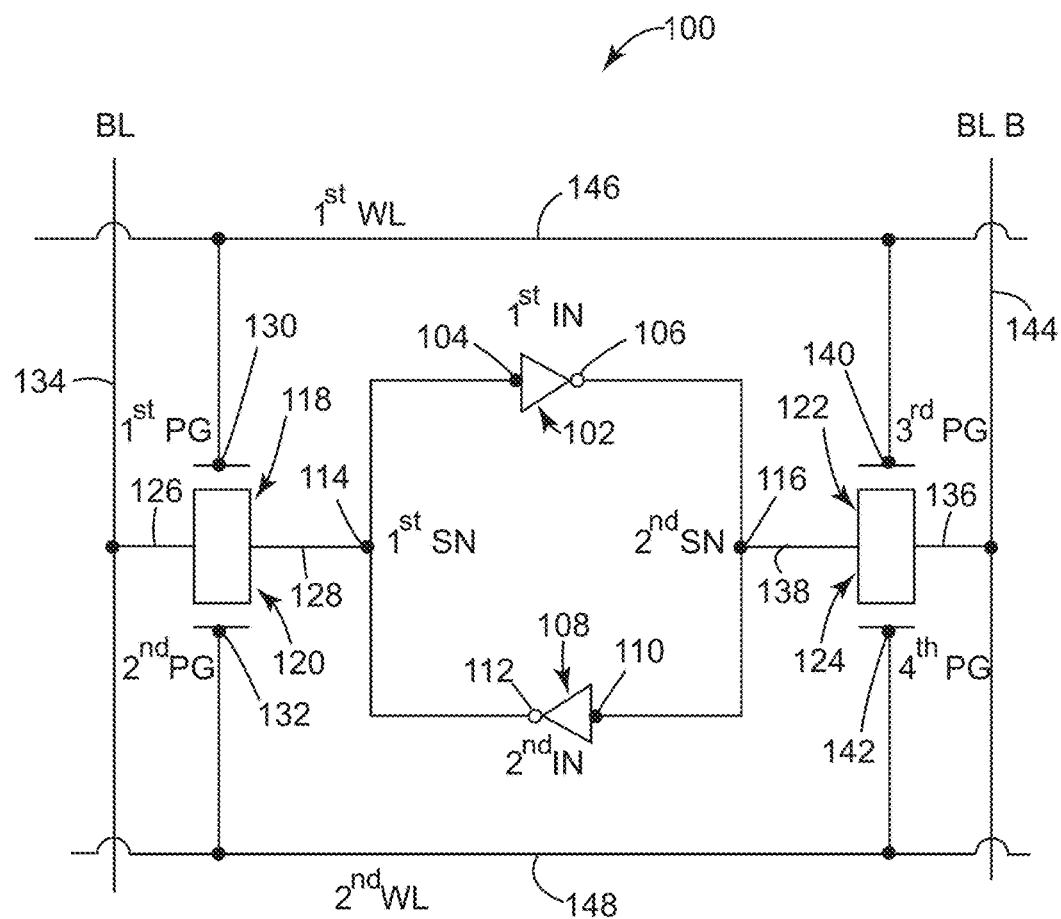
FIG. 4 is a schematic of an SRAM cell showing 1st, 2nd, 3rd and 4th pass gate transistors and a pair of cross coupled 1st and 2nd inverters in accordance with the present invention.

Referring to FIG. 4, a schematic of an SRAM cell 100 in accordance with the present invention is shown. In its most basic form, the static random access memory (SRAM) cell 100 includes a 1st inverter (1st IN) 102 having a first inverter input (1st IN-I) 104 and a first inverter output (1st IN-O) 106. SRAM cell 100 also includes a 2nd inverter (2nd IN) 108 having a second inverter input (2nd IN-I) 110 and a second inverter output (2nd IN-O) 112. The 1st IN 102 and 2nd IN 108 are electrically cross-coupled to form a first storage node (1st SN) 114 and a second storage node (2nd SN) 116. More specifically, the 1st IN-I 104 electrically contacts the 2nd IN-O 112 to form the 1st SN 114. Additionally, the 1st IN-O 106 electrically contacts the 2nd IN-I 110 to form the 2nd SN 116. By virtue of the cross-coupling, the two storage nodes 114, 116 will always have two opposing output signals and the SRAM cell 100 will always have two stable logic states. That is, the first logic state includes a logic 1 (or voltage high signal) at the 1st SN 114 and a logic 0 (or voltage low signal) at the 2nd SN 116. The second logic state includes a logic 0 at the 1st SN 114 and a logic 1 at the 2nd SN 116.

A system of four, typically n-type, pass gate transistors is structured to control data flow to and from the storage nodes 114, 116 at one mean drive current during a read operation and at another, substantially larger, mean drive current during a write operation. To achieve this, a first typically n-type pass gate transistor (1st PG) 118 and a second typically n-type pass gate transistor (2nd PG) 120 share a common source region and a common drain region, but have independently operated gate structures. Additionally, a third typically n-type pass gate transistor (3rd PG) 122 and a fourth typically n-type pass gate transistor (4th PG) 124 share a common source region and drain region, but have independently operated gate structures.

More specifically, the 1st pass gate transistor 118 has a source region (1st PG-S) 126, a drain region (1st PG-D) 128 and a gate structure (1st PG-G) 130. The 2nd pass gate transistor 120 shares the same source and drain regions 126, 128 as that of the 1st PG 118, but has a gate structure (2nd PG-G) 132 that is independently operated from that of the gate structure (1st PG-G) 130 of the 1st PG 118. The 1st PG-D 128 is in electrical contact with the 1st SN 114. The 1st PG-S 126 is in electrical contact with a bit line (BL) 134.

Additionally, the 3rd pass gate transistor 122 has a source region (3rd PG-S) 136, a drain region (3rd PG-D) 138 and a gate structure (3rd PG-G) 140. The 4th pass gate transistor 124 shares the same source and drain regions 136, 138 as that of the 3rd PG 122, but has a gate structure (4th PG-G) 142 that is independently operated from that of the gate structure (3rd PG-G) 140 of the 3rd PG 122. The 3rd PG-D 138 is in electrical contact with the 2nd SN 116. The 3rd PG-S 136 is in electrical contact with a bit line bar (BLB) 144.

A 1st word line (1st WL) 146 is in electric contact with the 1st PG-G 130 and the 3rd PG-G. 140. The 1st WL 146 is operative to enable (to turn on) and to disable (to turn off) the 1st PG 118 and the 3rd PG 122. A 2nd word line (2nd WL) 148 in electric contact with the 2nd PG-G 132 and the 4th PG-G 142. The 2nd WL 148 is operative to enable and disable the 2nd PG 120 and the 4th PG 124.

During operation, data is transmitted to and from the SRAM cell 100 through the bit line 134 and bit line bar 144 (herein collectively, the "bit lines" 134, 144) as the 1st and 2nd word lines 146, 148 activate the pass gates 118, 120, 122 and 124. More specifically, data will flow between the 1st SN 114 and the bit line 134 when either the 1st PG 118 is activated by the 1st WL or the 2nd PG 120 is activated by the 2nd WL. Additionally, data will flow between the 2nd SN 116 and the bit line bar 144 when either the 3rd PG 122 is activated by the 1st WL 146 or the 4th PG 124 is activated by the 2nd WL 148.

As discussed earlier herein, two of the most important parameters that affect SRAM stability are the well-known Beta and Gamma ratios. Basically, the two ratios can be expressed as:

Beta ratio=($Ion\_PD$)/($Ion\_PG$); and

Gamma ratio=($Ion\_PG$)/($Ion\_PU$);

wherein:
Ion_PD is the mean drive current flow through the pull-down transistor;
Ion_PG is the mean drive current flow through the pass gate transistor; and
Ion_PU is the mean drive current flow through the pull-up transistor.

During a read operation, it is desirable to have as high a Beta ratio as possible for purposes of stability, which tends to drive the mean drive current of the pass gate transistors down. During a write operation, it is desirable to have as high a gamma ratio as possible for purposes of stability, which tends to drive the mean drive current of the pass gate transistors up. In a prior art SRAM cell, like SRAM cell 10, these seemingly contradictory conditions are difficult to achieve.

Advantageously however, SRAM cell 100 can operate in a read operating mode having one pass gate mean drive current (i.e., one Ion_PG) and a write operating mode having another, substantially larger, pass gate mean drive current. To achieve the lower drive current read operating mode in this specific embodiment, the 1st WL 146 transmits a logic high signal to the 1st PG-G 130 and the 3rd PG-G 140 to enable the 1st PG 118 and 3rd PG 122 during a read operation. Additionally, the 2nd WL 148 transmits a logic low signal to the 2nd PG-G 132 and the 4th PG-G 142 to disable the 2nd PG 120 and 4th PG 124 during the same read operation. In this way, the 1st and 2nd pass gate transistors operate as single gate, single channel transistors.

To achieve the larger drive current write operating mode in this specific embodiment, the 1st WL 146 transmits a logic high signal to the 1st PG-G 130 and the 3rd PG-G 140 to enable the 1st PG 118 and 3rd PG 122 during a write operation. Additionally, the 2nd WL 148 transmits a logic high signal to the 2nd PG-G 132 and the 4th PG-G 142 to enable the 2nd PG 120 and 4th PG 124 during the same write operation. In this way, the 1st and 2nd pass gate transistors operate as double gate, double channel transistors. The double channel transistors have a larger mean drive current than the single channel transistors by such exemplary factors of 1.5 to 2 or greater.

Figure 5:
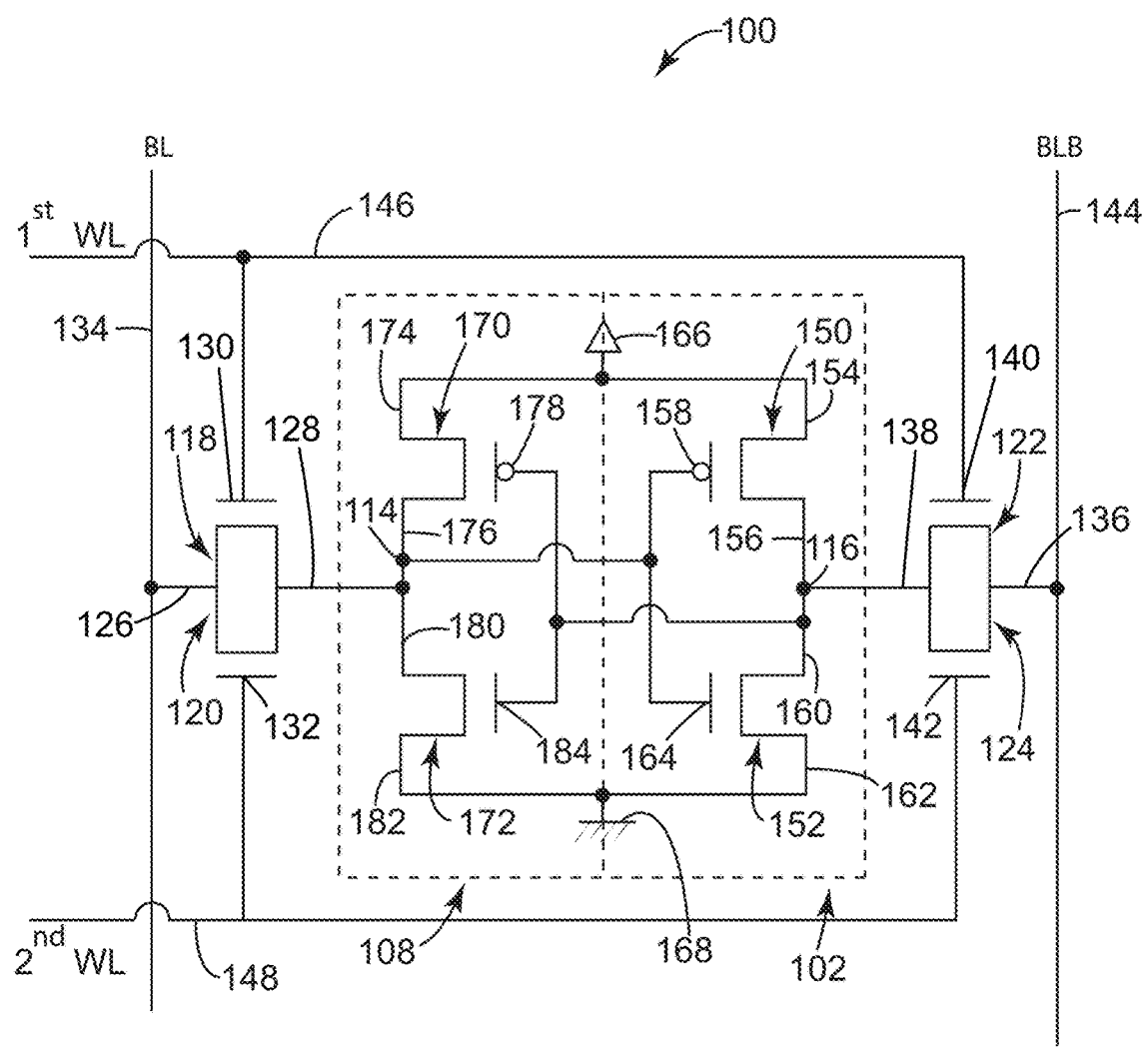
FIG. 5 is a schematic of the SRAM cell of FIG. 4 showing a pair of 1st pull-up and 1st pull-down transistors for the 1st inverter, and a pair of 2nd pull-up and 2nd pull-down transistors for the 2nd inverter in accordance with the present invention.

Referring to FIG. 5, the 1st inverter (1st IN) 102 of SRAM cell 100 commonly includes a first, typically p-type, pull-up transistor (1st PU) 150 and a first, typically n-type, pull-down transistor (1st PD) 152. The 1st pull-up transistor 150 has a source region (1st PU-S) 154, a drain region (1st PU-D) 156 and a gate structure (1st PU-G) 158. The 1st pull-down transistor 152 has a source region (1st PD-S) 160, a drain region (1st PD-D) 162 and a gate structure (1st PD-G) 164. The 1st PU-S 154 is in electric contact with a supply voltage 166. The 1st PD-D 162 is in electric contact with a voltage ground 168. The 1st PU-G 158 and the 1st PD-G 164 are commonly in electric contact with the 1st SN 114. The 1st PU-D 156 and the 1st PD-S 160 are commonly in electric contact with the 2nd SN 116.

The 2nd inverter (2nd IN) 108 of SRAM cell 100 commonly includes a second, typically p-type, pull-up transistor (2nd PU) 170 and a second, typically n-type, pull-down transistor (2nd PD) 172. The 2nd pull-up transistor 170 has a source region (2nd PU-S) 174, a drain region (2nd PU-D) 176 and a gate structure (2nd PU-G) 178. The 2nd pull-down transistor 172 has a source region (2nd PD-S) 180, a drain region (2nd PD-D) 182 and a gate structure (2nd PD-G) 184. The 2nd PU-S 174 is in electric contact with the same supply voltage 166. The 2nd PD-D 182 is in electric contact with the same voltage ground 168. The 2nd PU-G 178 and the 2nd PD-G 184 are commonly in electric contact with the 2nd SN 116. The 2nd PU-D 176 and the 2nd PD-S 180 are commonly in electric contact with the 1st SN 114.

The inverters 102 and 108 of SRAM cell 100 are composed of one pull-up transistor and one pull-down transistor each. However, it is well-known that other transistor numbers and configurations may be included in the design of the inverters 102 and 108.

Figure 6A:
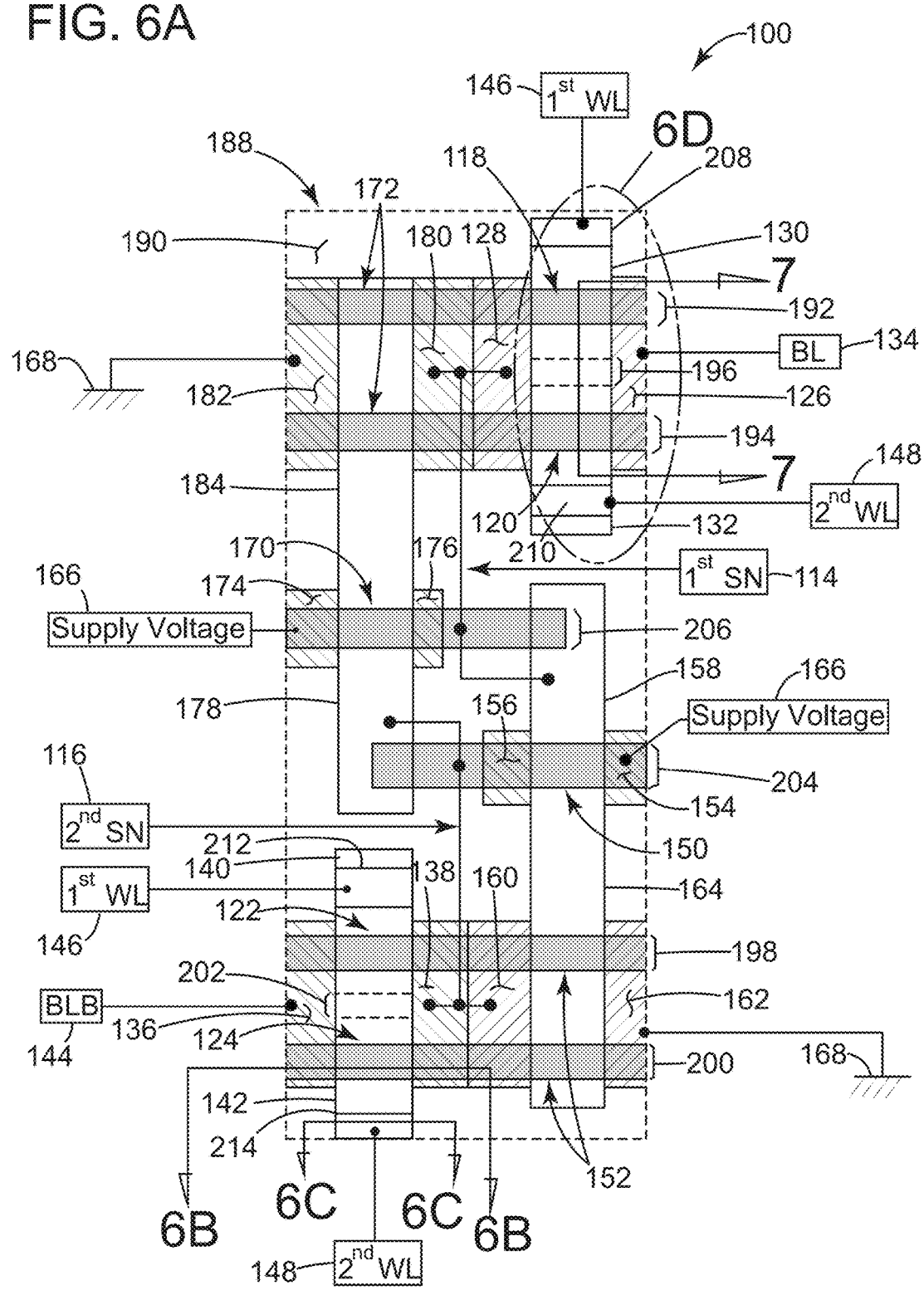
FIG. 6A is a top view layout of the SRAM cell of FIG. 5 on a semiconductor structure have a substrate layer in accordance with the present invention.

Referring to FIG. 6A, an exemplary embodiment of a layout of the SRAM cell 100 is illustrated as a FinFET SRAM cell 100 on a semiconductor structure 188 having a substrate layer (or substrate) 190. Disposed over the substrate 190 is an n-type 1st fin 192 and an adjacent, parallel, 2nd fin 194.

The 1st pass gate transistor (1st PG) 118 is embedded in the 1st fin 192. The 1st PG 118 includes its source region (1st PG-S) 126 which is disposed over and between the 1st and 2nd fins 192, 194. The drain region (1st PG-D) 128 of the 1st PG 118 is also disposed over and between the 1st and 2nd fins 192, 194. The gate structure (1st PG-G) 130 of the 1st PG 118 is disposed over the 1st fin 192 only and between the 1st PG-S 126 and 1st PG-D 128. The 1st PG-G 130 is electrically connected to the 1st word line (1st WL) 146 through a 1st CB contact 208. The 1st WL 146 is operable to enable and disable the 1st PG 118.

The 2nd pass gate transistor (2nd PG) 120 is embedded in the 2nd fin 194. The 2nd PG 120 includes the same 1st PG-S 126 and 1st PG-D 128. This can be done during formation of the source and drain regions 126, 128, wherein the regions 126, 128 are, for example, epitaxially grown from the 1st and 2nd fins 192, 194 to merge together.

The 2nd PG 120 also includes its 2nd gate structure (2nd PG-G) 132, which is disposed over the 2nd fin 194 only and between the 1st PG-S 126 and 1st PG-D 128. The 2nd PG-G 132 is electrically connected to the 2nd word line (2nd WL) 148 via a 2nd CB contact 210. The 2nd WL 148 is operable to enable and disable the 2nd PG 120.

A 1st CT pillar 196 is disposed between the 1st PG-G 130 and the 2nd PG-G 132. The 1st CT pillar 196 is composed of such material as silicon dioxide (SiO2) and is designed to provide electric isolation between the 1st PG-G 130 and the 2nd PG-G 132. As such, the two gate structures 130, 132 can operate independently of each other, even though the pass gate transistors 118, 120 share the same source 126 and drain 128 regions. Advantageously, the two independent gate structures 130, 132 coupled with the shared source 126 and drain 128 regions enable the pass gate transistors 118, 120 to function in two operating modes, i.e., a read operating mode and a write operating mode.

During a read operation, the pass gate transistors 118, 120 may function in a read operating mode wherein the 1st pass gate transistor 118 is enabled by the 1st word line 146 and the $2^{nd}$ pass gate transistor 120 is disabled by the $2^{nd}$ word line 148. As such, the pass gate transistors 118, 120 function as a single channel, single gate transistor. In the read operating mode, conduction between source 126 and drain 128 only occurs through a channel formed in the 1st fin 192.

During a write operation, the pass gate transistors 118, 120 may function in a write operating mode wherein both the 1st pass gate transistor 118 and the 2nd pass gate transistor 120 are enabled by the 1st and 2nd word lines 146, 148. As such, the pass gate transistors 118, 120 function as a dual channel, dual gate transistor. In the write operating mode, conduction between source 126 and drain 128 occurs through both a channel formed in the 1st fin 192 and a channel formed in the 2nd fin 194.

Since in the write operating mode, the channel cross-sectional area has doubled in size compared to that of the read operating mode, the pass gate transistors 118, 120 have significantly larger mean drive currents. More specifically, the mean drive currents of the pass gate transistors 118, 120 working together in the write operating mode may be greater than or equal to 1.5 times that of the pass gate transistor 118 working alone in the read operating mode. Even more preferably, the mean drive currents of the pass gate transistors 118, 120 working together in the write operating mode may be greater than or equal to 2.0 times that of the pass gate transistor 118 working alone in the read operating mode.

As such, beta ratio of the SRAM 100 is driven up during a read operation, and the gamma ratio of the SRAM cell 100 is driven up during a write operation. This increases stability for both the read and write operations for the SRAM cell 100. Additionally, it makes the overall stability of the SRAM cell 100 more tolerant of manufacturing variations than that of prior art SRAM cells.

Also disposed over the substrate 190 of the FinFET SRAM cell 100 is an n-type 3rd fin 198 and an adjacent 4th fin 200. Both the 3rd and 4th fins 198, 200 are parallel to the 1st and 2nd fins 192, 194.

The 3rd pass gate transistor (3rd PG) 122 is embedded in the 3rd fin 198. The 3rd PG 122 includes its source region (3rd PG-S) 136 which is disposed over and between the 3rd and 4th fins 198, 200. The drain region (3rd PG-D) 138 of the 3rd PG 122 is also disposed over and between the 3rd and 4th fins 198, 200. The gate structure (3rd PG-G) 140 of the 3rd PG 122 is disposed over the 3rd fin 198 only and between the 3rd PG-S 136 and 3rd PG-D 138. The 3rd PG-G 140 is electrically connected to the 1st word line (1st WL) 146 through a 3rd CB contact 212. The 1st WL 146 is operable to enable and disable the 3rd PG 122.

The 4th pass gate transistor (4th PG) 124 is embedded in the 4th fin 200. The 4th PG 124 includes the same 3rd PG-S 136 and 3rd PG-D 138. This can be done during formation of the source and drain regions 136, 138, wherein the regions 136, 138 are, for example, epitaxially grown from the 3rd and 4th fins 198, 200 to merge together.

The 4th PG 124 also includes its 4th gate structure (4th PG-G) 142, which is disposed over the 4th fin 200 only and between the 3rd PG-S 136 and 3rd PG-D 138. The 4th PG-G 142 is electrically connected to the 2nd word line (2nd WL) 148 via a 4th CB contact 214. The 2nd WL 148 is operable to enable and disable the 4th PG 124.

A 2nd CT pillar 202 is disposed between the 3rd PG-G 140 and the 4th PG-G 142. The 2nd CT pillar 202 is composed of such material as silicon dioxide (SiO2) and is designed to provide electric isolation between the 3rd PG-G 140 and the 4th PG-G 142. As such, the two gate structures 140, 142 can operate independently of each other, even though the pass gate transistors 122, 124 share the same source 136 and drain 138 regions.

Advantageously, the two independent gate structures 140, 142 coupled with the shared source 136 and drain 138 regions enable the pass gate transistors 122, 124 to function in the same two operating modes, i.e., the read operating mode and the write operating mode, as that of the 1st PG 118 and 2nd PG 120. As such, beta ratio of the SRAM 100 is driven up during a read operation, and the gamma ratio of the SRAM cell 100 is driven up during a write operation. This increases stability for both the read and write operations for the SRAM cell 100. Additionally, it makes the overall stability of the SRAM cell 100 more tolerant of manufacturing variations than that of prior art SRAM cells.

The FinFET SRAM cell 100 also includes the typically n-type 1st pull-down transistor (1st PD) 152 embedded in the same $3^{rd}$ and $4^{th}$ fins 198, 200 as that of the $3^{rd}$ and $4^{th}$ pass gate transistors 122, 124. The 1st PD 152 has its source region (1st PD-S) 160 disposed over the $3^{rd}$ 1st and $4^{th}$ fins 198, 200. The 1st PD-S 160 is in electric contact with the $3^{rd}$ PG-D 138 to form the $2^{nd}$ storage node ($2^{nd}$ SN) 116. In this embodiment, the 1st PD-S 160 and $3^{rd}$ PG-D 138 are merged together during formation to provide a single source/drain region.

Additionally, the drain region (1st PD-D) 162 of the 1st PD 152 is disposed over the $3^{rd}$ and $4^{th}$ fins 198, 200. The 1st PD-D 162 is electrically connected to the voltage ground 168.

The gate structure (1st PD-G) 164 of the 1st PD 152 is disposed over the $3^{rd}$ and $4^{th}$ fins 198, 200 and between the 1st PD-S 160 and 1st PD-D 162. The 1st PD 152 is a dual gate, dual channel transistor that conducts through channels formed in both the $3^{rd}$ and $4^{th}$ fins 198, 200. Unlike the $3^{rd}$ and $4^{th}$ PG 122, 124, there is no CT pillar between the $3^{rd}$ and $4^{th}$ fins 198, 200 to separate the gate structure 164 into two functioning gates.

The FinFET SRAM cell 100 also includes the typically n-type 2nd pull-down transistor (2nd PD) 172 embedded in the same $1^{st}$ and $2^{nd}$ fins 192, 194 as that of the $1^{st}$ and $2^{nd}$ pass gate transistors 118, 120. The 2nd PD 172 has its source region (2nd PD-S) 180 disposed over the $1^{st}$ and $2^{nd}$ fins 192, 194. The 2nd PD-S 180 is in electric contact with the $1^{st}$ PG-D 128 to form the $1^{st}$ storage node ($1^{st}$ SN) 114. In this embodiment, the 2nd PD-S 180 and $1^{st}$ PG-D 128 are merged together during formation to provide a single source/drain region.

Additionally, the drain region (2nd PD-D) 182 of the 2nd PD 172 is disposed over the $1^{st}$ and $2^{nd}$ fins 192, 194. The 2nd PD-D 182 is electrically connected to the voltage ground 168.

The gate structure (2nd PD-G) 184 of the 2nd PD 172 is disposed over the $1^{st}$ and $2^{nd}$ fins 192, 194 and between the 3rd PD-S 180 and 3rd PD-D 182. The 3rd PD 172 is a dual gate, dual channel transistor that conducts through channels formed in both the $1^{st}$ and $2^{nd}$ fins 192, 194. Unlike the $1^{st}$ and $2^{nd}$ PG 118, 120, there is no CT pillar between the $1^{st}$ and $2^{nd}$ fins 192, 194 to separate the gate structure 184 into two functioning gates.

The SRAM cell 100 also includes a typically p-type 5th fin 204 disposed on the substrate 190 parallel to the 1st fin 192. The p-type 1st pull-up transistor (1st PU) 150 is embedded in the 5th fin 204 only. In this embodiment, the 1st PU 150 functions strictly as a single fin transistor.

The 1st PU 150 has its source region (1st PU-S) 154 disposed over the 5th fin 204. The 1st PU-S 154 is electrically connected to the supply voltage 166. The drain region (1st PU-D) 156 of the 1st PU 150 is also disposed over the 5th fin 204. The 1st PU-D 156 is electrically connected to the $2^{nd}$ SN 116.

The gate structure (1st PU-G) 158 of the 1st PU 150 is disposed over the 5th fin 204 and between the 1st PU-S 154 and 1st PU-D 156. The 1st PU-G 158 is in electric contact with the 1st PD-G 164. In this particular embodiment, the 1st PU gate structure 158 and 1st PD gate structure 164 are combined together during formation to form a single gate structure that spans across both the single fin 1st PU 150 and the dual fin 1st PD 152

The SRAM cell 100 also includes a typically p-type 6th fin 206 disposed on the substrate 190 parallel to the 1st fin 192. The p-type 2nd pull-up transistor (1st PU) 170 is embedded in the 6th fin 206 only. In this embodiment, the 2nd PU 170 functions strictly as a single fin transistor.

The 2nd PU 170 has its source region (2nd PU-S) 174 disposed over the 6th fin 206. The 2nd PU-S 174 is electrically connected to the supply voltage 166. The drain region (2nd PU-D) 176 of the 2nd PU 170 is also disposed over the 6th fin 206. The 2nd PU-D 176 is electrically connected to the $1^{st}$ SN 114.

The gate structure (2nd PU-G) 178 of the 2nd PU 170 is disposed over the 6th fin 206 and between the 2nd PU-S 174 and 2nd PU-D 176. The 2nd PU-G 178 is in electric contact with the 2nd PD-G 184. In this particular embodiment, the 2nd PU gate structure 178 and 2nd PD gate structure 184 are combined together during formation to form a single gate structure that spans across both the single fin 2nd PU 170 and the dual fin 2nd PD 172

The SRAM cell 100 also includes the bit line 134, which is operative to transmit data to and from the SRAM cell, 100. The bit line 134 is electrically connected to the 1st PG-S 126. Additionally, the SRAM cell 100 includes the bit line bar 144, which is operative to transmit data to and from the SRAM cell 100. The bit line bar 144 is electrically connected to the 3rd PG-S 136.

Figure 6B:
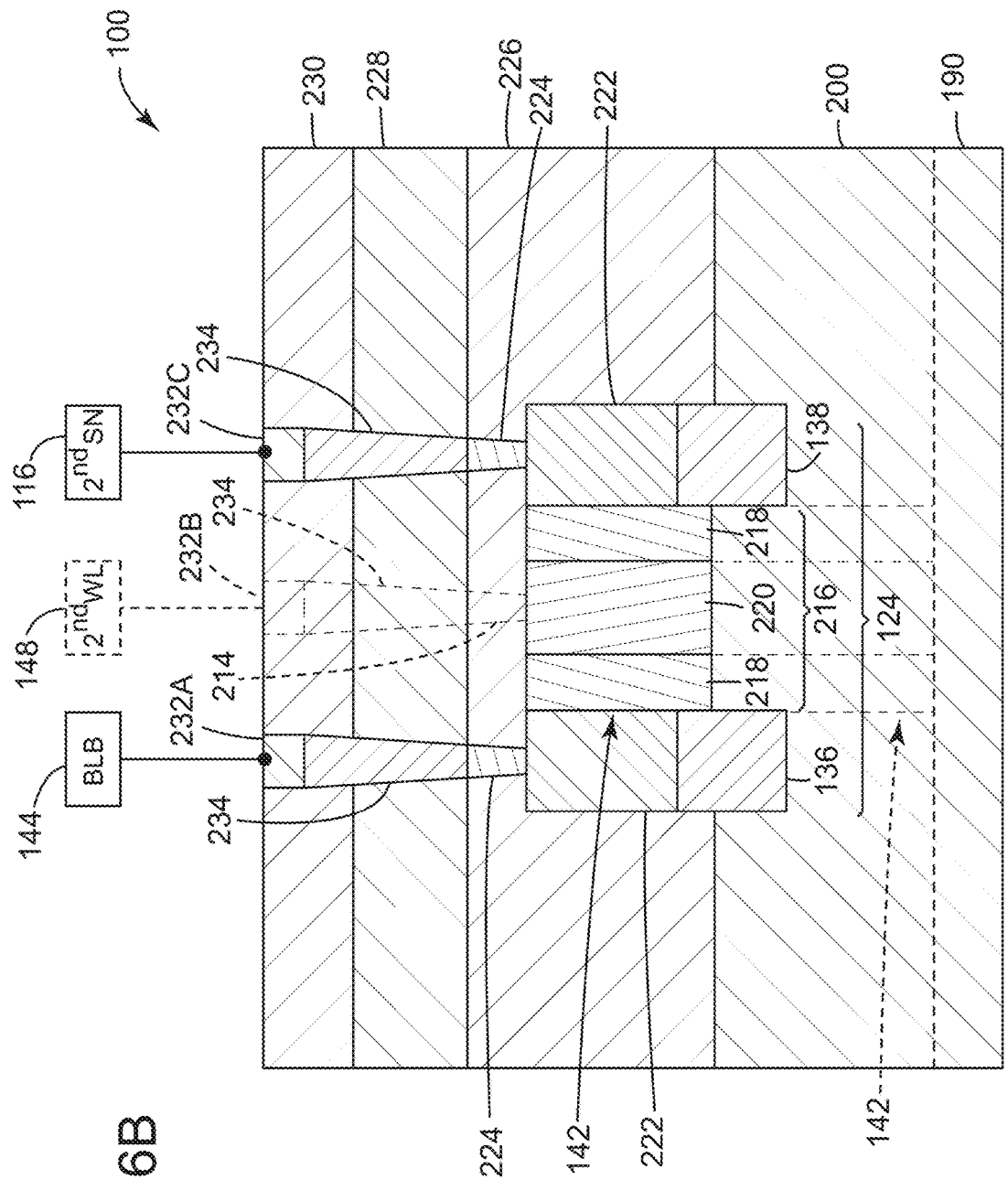
FIG. 6B is a cross sectional view of FIG. 6A taken along the cut line 6B-6B in accordance with the present invention.

Referring to FIG. 6B, a cross sectional side view of the 4th PG 124 of the SRAM cell 100 taken along the cut line 6B-6B of FIG. 6A is presented. In this exemplary embodiment the 4th PG 124 is shown embedded in fin 200, which is disposed over substrate 190. Additionally, a representative simplified structure of the electrical connections to the BLB 144, 2nd SN 116 and 2nd WL 148 is illustrated.

The n-type FinFET 4th PG 124 has its source region (3rd PG-S) 136 and drain region (3rd PG-D) 138 connected in between by a channel 216, which runs through fin 200. The channel 216 conducts current carriers (i.e., electrons or holes) from the source region 136 to the drain region 138. The structure of both the source region 136 and the drain region 138 are, in this embodiment, identical. Therefore, either region 136, 138 may function as a source or a drain depending on the direction of current flow.

The 4th PG 124 also includes the gate structure (4th PG-G) 142, which is wrapped around the channel 216 and is operable to control current flow through the channel 216. Since this cross sectional view of the 4th PG 124 is taken through the channel 216, the 4th PG-G 142 is shown disposed over the top of the channel 216.

The 4th PG-G 142 includes gate spacers 218 and gate metal 220. The gate structure 142 extends perpendicular to the fin 200 and spans from the 2nd CT pillar 202 to the edge of the SRAM cell 100 (best seen in FIG. 6A). The 4th CB contact 214 (shown in phantom in FIG. 6B and best seen in FIG. 6C) is disposed at the distal end of the 4th PG-G 142 such that it is in electrical contact with the gate metal 220 but does not contact any of the epitaxial source and drain regions 136, 138 that are grown around the fin 200.

Extending upwards from the source and drain regions 136, 138 are trench silicide layers 222. Extending upwards from the trench silicide layers 222 are CA contacts 224. Covering the SRAM cell 100 up to at least the level of the 4th CB contact 214 and the CA contacts 224 is an interlayer dielectric (ILD) layer 226.

Disposed over the ILD layer 226 is a complex stack of buried layers 228, which could be many combinations of layers depending on performance specifications. Disposed over the buried layers 228 is a dielectric layer 230, into which metal interconnect lines 232A, 232B and 232C are disposed.

The metal interconnect lines 232A, B, C are electrically connected to the source region 136, the drain region 138 and the gate structure 142 of the 4th PG 124 by various metal filled via 234. In the case of the source and drain regions 136, 138 specifically, the metal filled via 234 contact the CA contacts 224, which provide electrical continuity to the trench silicide layers 222. The trench silicide layers 222 provide electrical continuity to the source and drain regions 136, 138. The metal interconnect line 232A is electrically connected to the BLB 144 and provides electrical continuity from the BLB 144 to the source 136. The metal interconnect line 232C is electrically connected to the 2nd SN 116 and provides electrical continuity to the drain 138.

In the case of the gate structure 142 specifically, the metal filled via 234 contact the 4th CB contact 214, which provides electrical continuity to the gate structure 142. The metal interconnect line 232B is electrically connected to the 2nd WL 148 and provides electrical continuity to the 4th PG gate structure (4th PG-G) 142.

It is important to note, that the types of connections illustrated in FIG. 6B can be used throughout the SRAM cell 100 to make the various other electrical connections that enable the SRAM cell to function. For example, electrical connections from the 1st CB contact, 2nd CB contact and 3rd CB contact may be similarly made through metal interconnect lines to the 1st WL 146 and the 2nd WL 148. Also, electrical connections from the 1st PG-S 126 to the bit line 134, and from the 3rd PG-S 136 to the bit line bar 144, may be made via CA contacts through metal interconnect lines (not shown). Additionally, electrical connections that form the 1st SN 114 and 2nd SN 116 may be made via a combination of CB and CA contacts through other metal interconnect lines (not shown).

Referring to FIG. 6C, a cross sectional view of the 4th CB contact 214 of the SRAM cell 100 taken along the cut line 6C-6C of FIG. 6A is presented. In this exemplary embodiment the 4th CB contact 214 is shown disposed over top of the distal end of the gate structure (4th PG-G) 142. More specifically, the 4th CB contact 214 is disposed on the gate metal 220 of the 4th PG-G 142. In this cross sectional view however, the 4th PG-G 142 is not disposed over fin 200, but rather is disposed directly over the substrate 190.

The ILD layer 226 covers the SRAM cell 100 up at least to the level of the 4th CB contact 214. The stack of buried layer 228 is disposed over the ILD layer 226 and the dielectric layer 230 is disposed over the buried layers 228. As discussed with reference to FIG. 6B, the metal interconnect line 232B is electrically connected to the 4th CB contact 214 via the metal filled via 234 and the metal interconnect line 232B is also electrically connected to the 2nd WL 148.

Figure 6D:
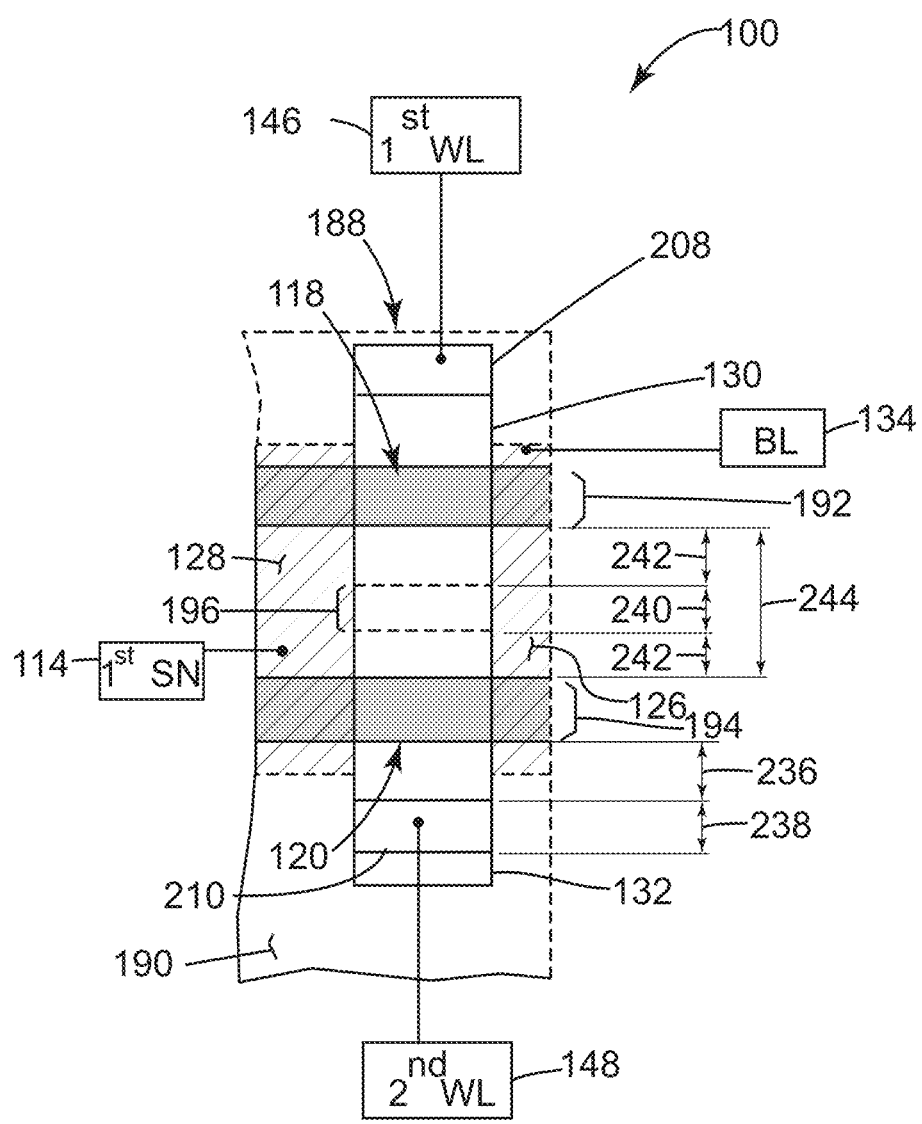
FIG. 6D is an enlarged top view of the 1st pass gate transistor and 2nd pass gate transistor of the SRAM cell of FIG. 6A within the area 6D of FIG. 6A 6C in accordance with the present invention.

Referring to FIG. 6D, an enlarged top view of the first pass gate transistor (1st PG) 118 and second pass gate transistor (2nd PG) 120 within the area 6D of FIG. 6A is presented. The 1st CT pillar 196 is shown between the gate structure (1st PG-G) 130 of 1st PG 118 and the gate structure (2nd PG-G) 132 of the 2nd PG 120. The 1st CB contact 208 and 2nd CB contact 210 are disposed at opposing distal ends of the 1st PG-G 130 and the 2nd PG-G 132 respectively.

It is the 1st CT pillar 196 that enables the 1st and 2nd PG-Gs 130, 132 to be independently controlled by the 1st and 2nd WLs 146, 148. This enables the SRAM cell 100 to operate in the dual mean drive current operating modes of a read operating mode and a larger mean drive current write operating mode.

Compared to prior art SRAM cells, such as SRAM cell 10 (best seen in FIG. 3), the SRAM cell 100 has two additional CT pillars (1st CT pillar 196 and 2nd CT pillar 202), as well as two additional CB contacts (2nd CB contact 210 and 4th CB contact 214). These additional features increase the overall layout area (an area in a plan parallel to the top surface of the substrate 190) of the SRAM cell 100 over that of a prior art SRAM cell.

This is because, the 2nd CB contact 210 (as well as the 4th CB contact 214) must be spaced a minimum distance 236 away from its associated fin 194 such that it does not come in contact with the source or drain regions 126, 128. Additionally the 2nd CB 210 has a finite width 238 that must be accounted for.

Moreover, the 1st CT pillar 196 (as well as the 2nd CT pillar 202) also has a finite width 240, which may, for example, be within a range of 14 to 20 nanometers (nm). Also, the 1st CT pillar 196 must be spaced a minimum distance 242 from the fins 192, 194, which may, for example, be within a range of 10 to 12 nm. Therefore the overall distance 244 between the n-type fins 192, 194 may be between 34-44 nm, which could be slightly larger than prior art n-type fin distances on prior art SRAM cells.

Nevertheless, the combination of the new CT contacts 196, 202 and the additional CB contacts 210, 214 in SRAM cell 100 does not increase the overall layout size by more than 16 percent compared to prior art SRAM cells. This small added layout area does not out weight the benefits of the dual mean drive current operating modes and increased stability that the additional structure provides to the SRAM cell 100.

Referring to FIG. 7, a cross sectional view of the SRAM cell 100 at an intermediate stage of manufacture taken along the cut line 7-7 of FIG. 6A is presented. FIG. 7 illustrates a method of forming a CT pillar (such as 1st CT pillar 196) between the n-type fins (such as fins 192 and 194) of an SRAM cell 100.

The method includes providing the semiconductor structure 188 for the SRAM cell 100, wherein the semiconductor structure 188 has the substrate 190. The 1st and a 2nd adjacent, and parallel, fins 192, 194 are disposed on the substrate 190. The 1st pass gate transistor (1st PG) 118 is formed in the 1st fin 192 (best seen in FIG. 6A). The 1st PG 118 has:

the source region (1st PG-S) 126 disposed over the 1st and 2nd fins 192, 194,
  the drain region (1st PG-D) 128 disposed over the 1st and 2nd fins 192, 194, and
  the 1st pass gate transistor gate structure (1st PG-G) 130 disposed over the 1st fin 192 and between the source and drain regions 126, 128.

The 2nd pass gate transistor (2nd PG) 120 is formed in the 2nd fin 194 (best seen in FIG. 6A). The 2nd PG 120 has:

the same source and drain regions 126, 128 as the 1st PG 118, and
  the 2nd pass gate transistor gate structure (2nd PG-G) 132 disposed over the 2nd fin 194 and between the source and drain regions 126, 128.

The 1st CT pillar 196 is disposed between the 1st PG-G 130 and 2nd PG-G 132. The 1st CT pillar 196 provides electric isolation between the 1st PG-G 130 and 2nd PG-G 132.

However, the deposition of the 1st CT pillar 196 between fins 192 and 192 can be done in a variety of exemplary methods. One such method is illustrated in more detail in FIGS. 7-10.

Referring back to FIG. 7, one such method of disposing the 1st CT pillar 196 between fins 192, 194 includes disposing an oxide layer 246 over the 1st and 2nd fins 192, 194 prior to forming the 1st PG 118 and 2nd PG 120. The oxide layer 246 is then recessed to expose an active area 248 of the 1st and 2nd fins 192, 194. The active area 248 extends vertically above the oxide layer 246.

A polysilicon layer 250 and a hardmask layer 252 are next disposed respectively over the entire semiconductor structure 188. The polysilicon layer 250 covers the fins 192, 194. The hardmask layer 252 may be composed of a silicon nitride (SiN) or similar material.

Next the polysilicon layer 250 and hardmask layer 252 are lithographically patterned through well-known processes (such as standard lithographic processes and anisotropic etching) to form a dummy polysilicon gate 254 over the 1st and 2nd fins 192, 194. The polysilicon gate 254 is disposed in the same location as that of the 1st PG-G 130 and 2nd PG-G 132.

Gate spacers 255 (best seen in FIG. 12, and similar to gate spacers 218 as seen in FIGS. 6B and 6C) are next formed on sidewalls of the dummy gate 254. The gate spacers 255 can be formed by atomic layer deposition (ALD) of a spacer layer of such material as silicon nitride (SiN). The spacer layer can then be RIE etched to form the gate spacers.

A well-known lithographic stack 256 is next disposed over the semiconductor structure 188. A CT opening 258 is then patterned into the lithographic stack 256 though well know lithographic processes.

Referring to FIG. 8, a CT trench 260 is anisotropically etched into the hardmask layer 252. The anisotropic etching may be by a RIE process or similar. The lithographic stack is then removed by such means as wet etching or similar.

Referring to FIG. 9, the CT trench 260 is further anisotropically etched into the polysilicon layer dummy gate 254. This can also be done by a RIE process or similar.

Referring to FIG. 10, CT spacers 262 are next formed on sidewalls of the CT trench 260. The CT spacers 262 can also be formed by atomic layer deposition (ALD) of a CT spacer layer of such material as silicon nitride (SiN). The CT spacer layer can then be RIE etched to form the CT spacers 262.

Once the CT spacers 262 are formed, the source 126 and drain 128 regions (best seen in FIG. 12 and similar to source 136 and drain 138 regions as seen in FIG. 6B) can be formed through well know procedures and processes. For example, exposed portions of the 1st and 2nd fins 192, 194 can be etched down to form exposed recessed portions of the 1st and 2nd fins. Then the source and drain regions 126, 128 can be epitaxially grown on the exposed recessed portions of the 1st and 2nd fins 192, 194.

Referring to FIG. 11, next an insulating layer 263 can be disposed over the semiconductor structure 188 to cover the SRAM cell 100, fill the CT trench 260 and complete formation of the CT pillar 196. The CT pillar, now includes both the insulating layer 263 disposed in the CT trench 260 plus the pair of CT spacers 262. At that point, the insulating layer can be planarized down to expose the polysilicon dummy gate 254 and CT pillar 196.

Figure 12:
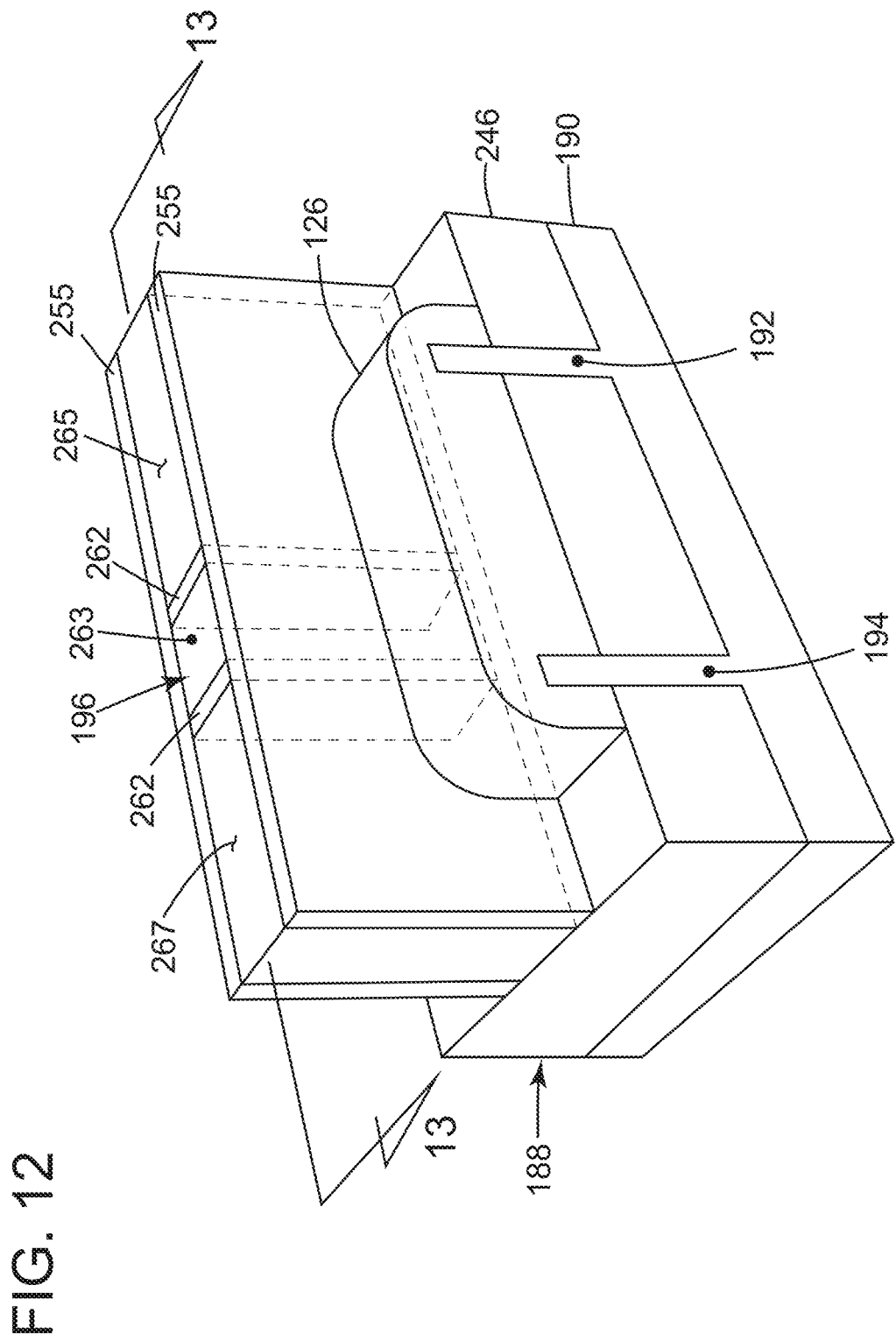
FIG. 12 is a perspective view of the SRAM cell of FIG. 11 after the polysilicon dummy gate has been removed in accordance with the present invention.

Referring to FIG. 12, a perspective view of the SRAM cell 100 of FIG. 11 after the polysilicon dummy gate 254 has been removed is presented. The polysilicon dummy gate 254 can then be removed via wet etch or similar. Removal of the dummy gate 254 forms a 1st gate trench 265 over the 1st fin 192 and a 2nd gate trench 267 over the 2nd fin 194. The gate trenches 265, 267 would be separated by the CT pillar 196.

Figure 13:
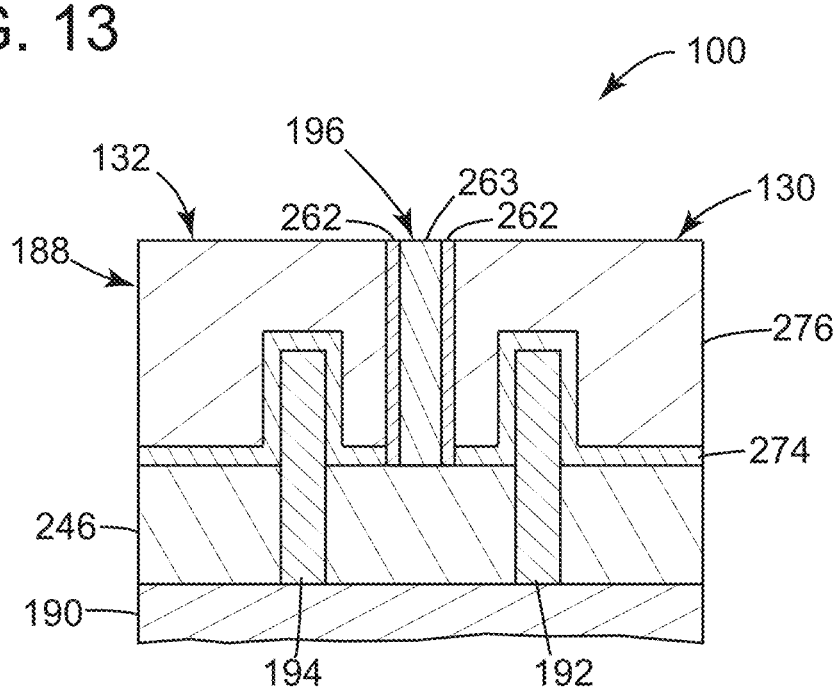
FIG. 13 is a side cross sectional view of the SRAM cell of FIG. 12 after deposition of a metal layer taken along the cut line 13-13 of FIG. 13 in accordance with the present invention.

Referring to FIG. 13 a side cross sectional view of FIG. 12 after deposition of a metal layer 276 taken along the line 13-13 of FIG. 13 is presented. Next a high k dielectric layer 274 and then a metal layer 276 can then be disposed over the semiconductor structure 188. The metal layer 276 may next be planarized down to form the 1st pass gate transistor gate structure (PG-G 130) in the 1st gate trench 265 and the 2nd pass gate transistor gate structure (PG-G) 132 in the 2nd gate trench 267. The 1st and 2nd PG-G 130, 132 are now electrically isolated by the 1st CT pillar 196.

Figure 14:
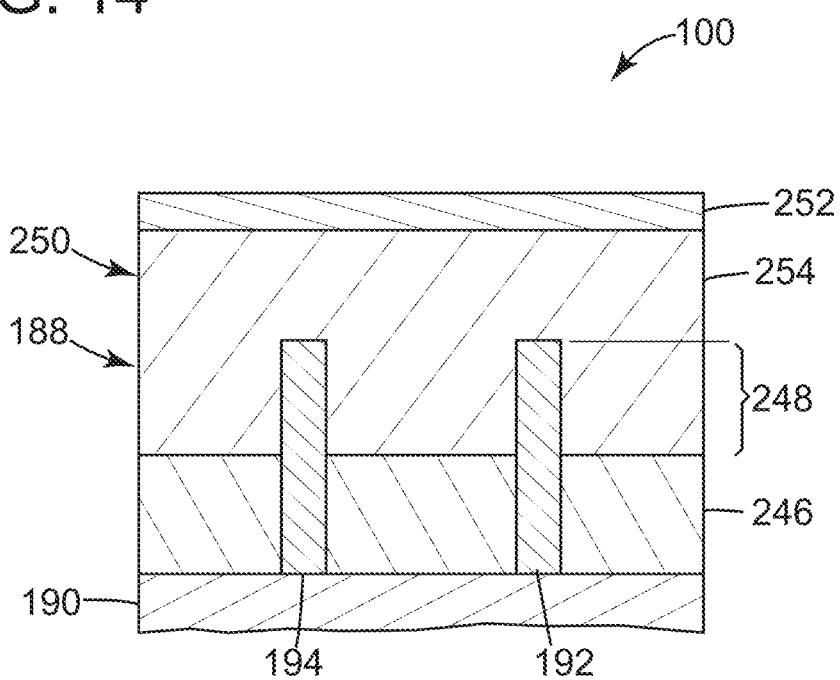
FIG. 14 is an alternative cross sectional view of the SRAM cell of FIG. 6A at an intermediate stage of manufacture taken along the cut line 7-7 of FIG. 6A in accordance with the present invention.

Referring to FIG. 14, an alternative cross sectional view of the SRAM cell 100 at an intermediate stage of manufacture taken along the cut line 7-7 of FIG. 6A is presented. Starting with FIG. 14, an alternative method of forming the 1st CT pillar 196 can be done by forming a CT trench 270 (best seen in FIG. 18) into a metal gate structure 276 after the polysilicon dummy gate 254 has been removed. This method starts in similar fashion as discussed earlier with reference to FIG. 7 in that the oxide layer 246 is disposed over the 1st and 2nd fins 192, 194 prior to forming the 1st PG 118 and 2nd PG 120. The oxide layer 246 is the recessed to expose the active area 248 of the 1st and 2nd fins 192, 194.

The polysilicon layer 250 and the hardmask layer 252 are next disposed respectively over the entire semiconductor structure 188. The polysilicon layer 250 covers the fins 192, 194. The hardmask layer 252 may be composed of a silicon nitride (SiN) or similar material.

Next the polysilicon layer 250 and hardmask layer 252 are lithographically patterned through well-known processes (such as standard lithographic processes and anisotropic etching) to form a dummy polysilicon gate 254 over the 1st and 2nd fins 192, 194. The polysilicon gate 254 is disposed in the same location as that of the 1st PG-G 130 and 2nd PG-G 132.

Figure 15:
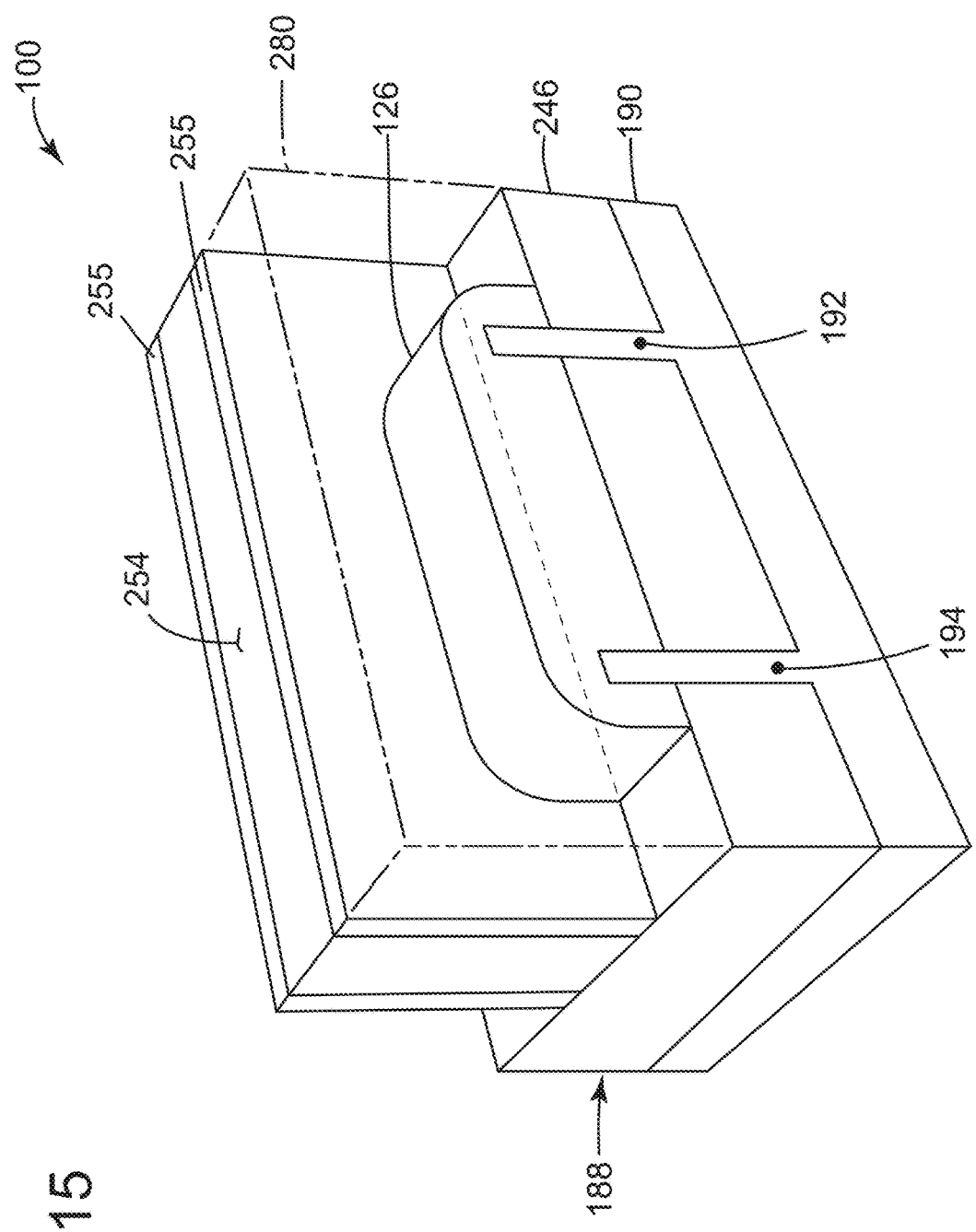
FIG. 15 is a perspective view of the SRAM cell of FIG. 14 after a polysilicon dummy gate, gate spacers, 1st source region and 1st drain region are formed thereon in accordance with the present invention.

Referring to FIG. 15, a perspective view of the SRAM cell 100 of FIG. 14 after formation of the polysilicon dummy gate 254, gate spacers 255, 1st source region 126 and 1st drain region 128 (best seen in FIG. 6A) is presented. The gate spacers 255 are next formed on sidewalls of the dummy gate 254. The gate spacers 255 can be formed by atomic layer deposition (ALD) of a spacer layer (not shown) of such material as silicon nitride (SiN). The spacer layer can then be RIE etched to form the gate spacers 255.

However, during this alternative process, no CT trench 260 is formed in the polysilicon gate 254. Rather, once the gate spacers 255 are formed, the source 126 and drain 128 regions can be formed through well know procedures and processes. For example, exposed portions of the 1st and 2nd fins 192, 194 can be etched to form exposed recessed portions of the 1st and 2nd fins. Then the source and drain regions 126, 128 can be epitaxially grown on the exposed recessed portions of the 1st and 2nd fins 192, 194.

Next a 1st insulating layer 280 can be disposed over the semiconductor structure 188 to cover the semiconductor structure 188. At that point, the insulating layer 280 can be planarized down to expose the polysilicon dummy gate 254.

Figure 16:
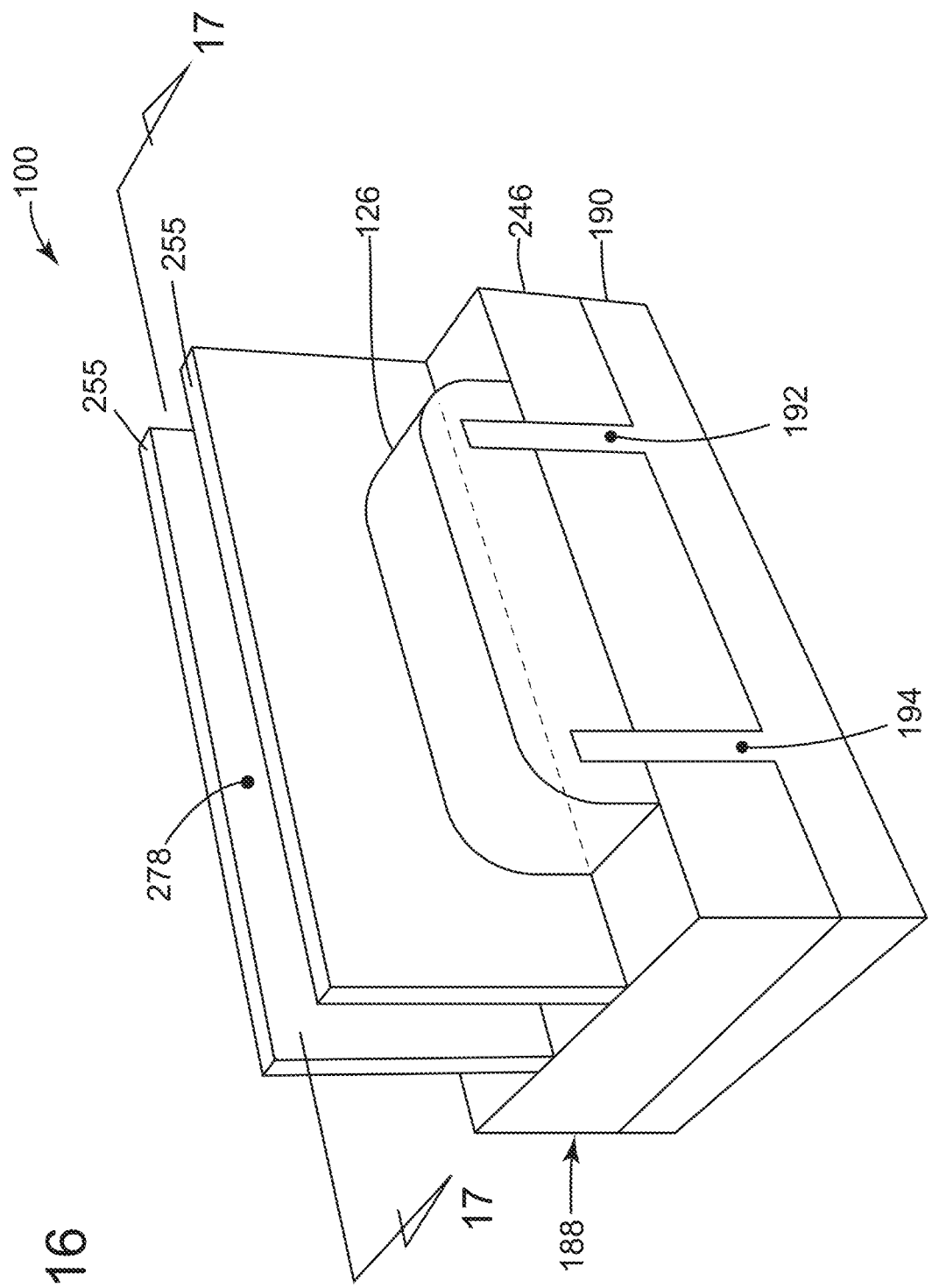
FIG. 16 is a perspective view of the SRAM cell of FIG. 15 after the polysilicon dummy gate has been removed in accordance with the present invention.

Referring to FIG. 16, a perspective view of the SRAM cell 100 of FIG. 15 after the polysilicon dummy gate 254 has been removed is presented. The polysilicon dummy gate 254 can then be removed to form a gate trench 278 over the 1st fin 192 and the 2nd fin 194. This can be done via a wet etch process or similar.

Referring to FIG. 17, a cross sectional view of the SRAM cell 100 of FIG. 16 after the metal layer 276 is disposed thereon taken along the cut line 17-17 of FIG. 16 is presented. Next the high k dielectric layer 274 and the metal layer 276 can then be disposed over the semiconductor structure 188. The metal layer 276 may next be planarized down to form a metal gate structure 264 over the 1st and 2nd fins 192, 194.

Next a lithographic stack 266 is disposed over the semiconductor structure 188. A CT opening 268 is then patterned into the lithographic stack 266. This can be done by well-known lithographic processes and anisotropic etching.

Referring to FIG. 18, a CT trench 270 is next etched into the metal gate structure 264 between the 1st and 2nd fins 192, 194. This can be done by an anisotropic etch process, such as a RIE process or similar.

Referring to FIG. 19, next a 2nd insulating layer 272 is disposed over the metal gate structure 264 and into the CT trench 270 to form the 1st CT pillar 196. The 1st CT pillar 196 separates the metal gate structure 264 into the 1st PG-G 130 and 2nd PG-G 132.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A static random access memory (SRAM) cell comprising:
   a $1^{st}$ and a $2^{nd}$ adjacent, and parallel, fins disposed on a substrate;
   a $1^{st}$ pass gate transistor ($1^{st}$ PG) embedded in the $1^{st}$ fin having:
   a source region ($1^{st}$ PG-S) disposed over the $1^{st}$ and $2^{nd}$ fins,
   a drain region ($1^{st}$ PG-D) disposed over the $1^{st}$ and $2^{nd}$ fins, and
   a $1^{st}$ gate structure ($1^{st}$ PG-G) disposed over the $1^{st}$ fin and between the $1^{st}$ PG-S and $1^{st}$ PG-D, the $1^{st}$ PG-G electrically connected to a $1^{st}$ word line ($1^{st}$ WL), the $1^{st}$ WL operable to enable the $1^{st}$ PG;
   a $2^{nd}$ pass gate transistor ($2^{nd}$ PG) embedded in the $2^{nd}$ fin having:
   the same $1^{st}$ PG-S and $1^{st}$ PG-D, and
   a $2^{nd}$ gate structure ($2^{nd}$ PG-G) disposed over the $2^{nd}$ fin and between the $1^{st}$ PG-S and $1^{st}$ PG-D, the $2^{nd}$ PG-G electrically connected to a $2^{nd}$ word line ($2^{nd}$ WL), the $2^{nd}$ WL operable to enable the $2^{nd}$ PG; and
   a $1^{st}$ CT pillar disposed between the $1^{st}$ PG-G and $2^{nd}$ PG-G, the $1^{st}$ CT pillar providing electric isolation between the $1^{st}$ PG-G and $2^{nd}$ PG-G.

2. The SRAM cell of claim 1 comprising:
   a $3^{rd}$ and a $4^{th}$ adjacent fins disposed on the substrate parallel to the $1^{st}$ fin;
   a $3^{rd}$ pass gate transistor ($3^{rd}$ PG) embedded in the $3^{rd}$ fin having:
   a source region ($3^{rd}$ PG-S) disposed over the $3^{rd}$ and $4^{th}$ fins,
   a drain region ($3^{rd}$ PG-D) disposed over the $3^{rd}$ and $4^{th}$ fins, and
   a $3^{rd}$ gate structure ($3^{rd}$ PG-G) disposed over the $3^{rd}$ fin and between the $3^{rd}$ PG-S and $3^{rd}$ PG-D, the $3^{rd}$ PG-G electrically connected to the $1^{st}$ WL, the $1^{st}$ WL operable to enable the $3^{rd}$ PG;
   a $4^{th}$ pass gate transistor ($4^{th}$ PG) embedded in the $4^{th}$ fin having:
   the same $3^{rd}$ PG-S and $3^{rd}$ PG-D, and
   a $4^{th}$ gate structure ($4^{th}$ PG-G) disposed over the $4^{th}$ fin and between the $3^{rd}$ PG-S and $3^{rd}$ PG-D, the $4^{th}$ PG-G electrically connected to the $2^{nd}$ WL, the $2^{nd}$ WL operable to enable the $4^{th}$ PG; and
   a $2^{nd}$ CT pillar disposed between the $3^{rd}$ PG-G and $4^{th}$ PG-G, the $2^{nd}$ CT pillar providing electric isolation between the $3^{rd}$ PG-G and $4^{th}$ PG-G.

3. The SRAM cell of claim 1 comprising:
   a read operating mode of the SRAM cell including:
   the $1^{st}$ WL operative to transmit a logic high signal to the $1^{st}$ PG-G to enable the $1^{st}$ PG during a read operation, and
   the $2^{nd}$ WL operative to transmit a logic low signal to the $2^{nd}$ PG-G to disable the $2^{nd}$ PG during the same read operation; and
   a write operating mode of the SRAM cell including:
   the $1^{st}$ WL operative to transmit a logic high signal to the $1^{st}$ PG-G to enable the $1^{st}$ PG during a write operation, and
   the $2^{nd}$ WL operative to transmit a logic high signal to the $2^{nd}$ PG-G to enable the $2^{nd}$ PG during the same write operation.

4. The SRAM cell of claim 2 comprising:
   a $2^{nd}$ pull-down transistor ($2^{nd}$ PD) embedded in the $1^{st}$ and $2^{nd}$ fins having:
   a source region ($2^{nd}$ PD-S) disposed over the $1^{st}$ and $2^{nd}$ fins, the $2^{nd}$ PD-S in electric contact with the 1 PG-D to form a $1^{st}$ storage node ($1^{st}$ SN),
   a drain region ($2^{nd}$ PD-D) disposed over the $1^{st}$ and $2^{nd}$ fins, the $2^{nd}$ PD-D electrically connected to a voltage ground, and
   a gate structure ($2^{nd}$ PD-G) disposed over the $1^{st}$ and $2^{nd}$ fins and between the $2^{nd}$ PD-S and $2^{nd}$ PD-D.

5. The SRAM cell of claim 2 comprising:
   a read operating mode of the SRAM cell including:
   the $1^{st}$ WL operative to transmit a logic high signal to the $1^{st}$ PG-G and the $3^{rd}$ PG-G to enable the $1^{st}$ PG and $3^{rd}$ PG during a read operation, and
   the $2^{nd}$ WL operative to transmit a logic low signal to the $2^{nd}$ PG-G and the $4^{th}$ PG-G to disable the $2^{nd}$ PG and $4^{th}$ PG during the same read operation; and
   a write operating mode of the SRAM cell including:
   the $1^{st}$ WL operative to transmit a logic high signal to the $1^{st}$ PG-G and the $3^{rd}$ PG-G to enable the $1^{st}$ PG and $3^{rd}$ PG during a write operation, and
   the $2^{nd}$ WL operative to transmit a logic high signal to the $2^{nd}$ PG-G and $4^{th}$ PG-G to enable the $2^{nd}$ PG and $4^{th}$ PG during the same write operation.

6. The SRAM cell of claim 4 comprising:
   a $1^{st}$ pull-down transistor ($1^{st}$ PD) embedded in the $3^{rd}$ and $4^{th}$ fins having:
   a source region ($1^{st}$ PD-S) disposed over the $3^{rd}$ and $4^{th}$ fins, the $1^{st}$ PD-S in electric contact with the $3^{rd}$ PG-D to form a $2^{nd}$ storage node ($2^{nd}$ SN),
   a drain region ($1^{st}$ PD-D) disposed over the $3^{rd}$ and $4^{th}$ fins, the $1^{st}$ PD-D electrically connected to the voltage ground, and
   a gate structure ($1^{st}$ PD-G) disposed over the $3^{rd}$ and $4^{th}$ fins and between the $1^{st}$ PD-S and $1^{st}$ PD-D.

7. The SRAM cell of claim 6 comprising:
   a $5^{th}$ fin disposed on the substrate parallel to the $1^{st}$ fin; and
   a $1^{st}$ pull-up transistor ($1^{st}$ PU) embedded in the $5^{th}$ fin having:
   a source region ($1^{st}$ PU-S) disposed over the $5^{th}$ fin, the $1^{st}$ PU-S electrically connected to a supply voltage,
   a drain region ($1^{st}$ PU-D) disposed over the $5^{th}$ fin, the $1^{st}$ PU-D electrically connected to the $2^{nd}$ SN, and
   a gate structure ($1^{st}$ PU-G) disposed over the $5^{th}$ fin and between the $1^{st}$ PU-S and $1^{st}$ PU-D, the $1^{st}$ PU-G in electric contact with the $1^{st}$ PD-G.

8. The SRAM cell of claim 7 comprising:
   a $6^{th}$ fin disposed on the substrate parallel to the $1^{st}$ fin;
   a $2^{nd}$ pull-up transistor ($2^{nd}$ PU) embedded in the $6^{th}$ fin having:
   a source region ($2^{nd}$ PU-S) disposed over the $6^{th}$ fin, the $2^{nd}$ PU-S electrically connected to the supply voltage,
   a drain region ($2^{nd}$ PU-D) disposed over the $6^{th}$ fin, the $2^{nd}$ PU-D electrically connected to the $1^{st}$ SN, and
   a gate structure ($2^{nd}$ PU-G) disposed over the $6^{th}$ fin and between the $2^{nd}$ PU-S and $2^{nd}$ PU-D, the $2^{nd}$ PU-G in electric contact with the $2^{nd}$ PD-G; and
   wherein the $1^{st}$ PU-D is electrically connected to the $2^{nd}$ PU-G, and the $2^{nd}$ PU-D is electrically connected to the $1^{st}$ PU-G.

9. The SRAM cell of claim 8 comprising:
   a bit line, operative to transmit data to and from the SRAM cell, is electrically connected to the $1^{st}$ PG-S; and a bit line bar, operative to transmit data to and from the SRAM cell, is electrically connected to the $3^{rd}$ PG-S.

10. A method comprising:

providing a semiconductor structure for an SRAM cell, the semiconductor structure having a substrate;

disposing a $1^{st}$ and a $2^{nd}$ adjacent, and parallel, fins on the substrate;

forming a $1^{st}$ pass gate transistor ($1^{st}$ PG) in the $1^{st}$ fin, the $1^{st}$ PG having:
- a source region disposed over the $1^{st}$ and $2^{nd}$ fins,
- a drain region disposed over the $1^{st}$ and $2^{nd}$ fins, and
- a $1^{st}$ pass gate transistor gate structure ($1^{st}$ PG-G) disposed over the $1^{st}$ fin and between the source and drain regions;

forming a $2^{nd}$ pass gate transistor ($2^{nd}$ PG) in the $2^{nd}$ fin, the $2^{nd}$ PG having:
- the same source and drain regions as the $1^{st}$ PG, and
- a $2^{nd}$ pass gate transistor gate structure ($2^{nd}$ PG-G) disposed over the $2^{nd}$ fin and between the source and drain regions; and disposing a CT pillar between the $1^{st}$ PG-G and $2^{nd}$ PG-G, the CT pillar providing electric isolation between the $1^{st}$ PG-G and $2^{nd}$ PG-G.

11. The method of claim 10 comprising:

disposing an oxide layer over the $1^{st}$ and $2^{nd}$ fins prior to forming the $1^{st}$ PG and $2^{nd}$ PG;

recessing the oxide layer to expose an active area of the $1^{st}$ and $2^{nd}$ fins;

disposing a polysilicon layer and a hardmask layer respectively over the semiconductor structure;

patterning the polysilicon layer and hardmask layer to form a dummy gate over the $1^{st}$ and $2^{nd}$ fins;

forming gate spacers on sidewalls of the dummy gate;

disposing a lithographic stack over the semiconductor structure;

patterning a CT opening into the lithographic stack;

etching a CT trench into the hardmask layer and polysilicon layer; and forming CT spacers on sidewalls of the CT trench.

12. The method of claim 10 comprising:

disposing an oxide layer over the $1^{st}$ and $2^{nd}$ fins prior to forming the $1^{st}$ PG and $2^{nd}$ PG;

recessing the oxide layer to expose an active area of the $1^{st}$ and $2^{nd}$ fins;

disposing a polysilicon layer and a hardmask layer respectively over the semiconductor structure;

patterning the polysilicon layer and hardmask layer to form a polysilicon dummy gate over the $1^{st}$ and $2^{nd}$ fins;

forming gate spacers on sidewalls of the dummy gate;

etching exposed portions of the $1^{st}$ and $2^{nd}$ fins to form exposed recessed portions of the $1^{st}$ and $2^{nd}$ fins; and forming an epitaxial layer on the exposed recessed portions of the $1^{st}$ and $2^{nd}$ fins to form the source and drain regions.

13. The method of claim 11 comprising:

etching exposed portions of the $1^{st}$ and $2^{nd}$ fins to form exposed recessed portions of the $1^{st}$ and $2^{nd}$ fins;

forming an epitaxial layer on the exposed recessed portions of the $1^{st}$ and $2^{nd}$ fins to form the source and drain regions; and disposing an insulating layer over the semiconductor structure to cover the semiconductor structure and form the CT pillar.

14. The method of claim 13 comprising;

planarizing the insulating layer to expose the polysilicon dummy gate and CT pillar;

removing the polysilicon dummy gate to form a $1^{st}$ gate trench over the $1^{st}$ fin and a $2^{nd}$ gate trench over the $2^{nd}$ fin, the gate trenches separated by the CT pillar;

disposing a metal layer over the semiconductor structure; and planarizing the metal layer to form the $1^{st}$ PG-G in the $1^{st}$ gate trench and $2^{nd}$ PG-G in the $2^{nd}$ gate trench.

15. The method of claim 12 comprising:

disposing a $1^{st}$ insulating layer over the semiconductor structure to cover the semiconductor structure;

planarizing the $1^{st}$ insulating layer to expose the polysilicon dummy gate;

removing the polysilicon dummy gate to form a gate trench over the $1^{st}$ and $2^{nd}$ fins;

disposing a metal layer over the semiconductor structure; and planarizing the metal layer to form a metal gate structure over the $1^{st}$ and $2^{nd}$ fins.

16. The method of claim 15 comprising:

disposing a lithographic stack over the semiconductor structure;

patterning a CT opening into the lithographic stack;

etching a CT trench into the metal gate structure between the $1^{st}$ and $2^{nd}$ fins;

disposing a $2^{nd}$ insulating layer over the metal gate structure to form the CT pillar, the CT pillar separating the metal gate structure into the $1^{st}$ PG-G and $2^{nd}$ PG-G.

* * * * *